US012578280B2

(12) United States Patent
    Shimizu

(10) Patent No.:    US 12,578,280 B2
(45) Date of Patent:       Mar. 17, 2026

(54) SUBSTRATE PROCESSING APPARATUS AND MONITORING METHOD

(71) Applicant: SCREEN Holdings Co., Ltd., Kyoto (JP)

(72) Inventor: Shinji Shimizu, Kyoto (JP)

(73) Assignee: SCREEN Holdings Co., Ltd., Kyoto (JP)

( * ) Notice:    Subject to any disclaimer, the term of this patent is extended or adjusted under 35 U.S.C. 154(b) by 0 days.

(21) Appl. No.:    18/713,378

(22) PCT Filed:    Jan. 20, 2023

(86) PCT No.:    PCT/JP2023/001713
    § 371 (c)(1),
    (2) Date:    May 24, 2024

(87) PCT Pub. No.: WO2023/153174
    PCT Pub. Date: Aug. 17, 2023

(65)              Prior Publication Data
    US 2025/0024155 A1      Jan. 16, 2025

(30)        Foreign Application Priority Data
    Feb. 9, 2022    (JP) ................................. 2022-018670

(51) Int. Cl.
    *G01N 21/88*        (2006.01)
    *G06T 7/00*          (2017.01)
    (Continued)

(52) U.S. Cl.
    CPC ......... *G01N 21/8806* (2013.01); *G01N 21/88* (2013.01); *G01N 21/8803* (2013.01);
    (Continued)

(58) Field of Classification Search
    CPC ....... G06T 7/00; G06T 7/0002; G06T 7/0004; G01N 21/88; G01N 2021/8848;
    (Continued)

(56)                References Cited

U.S. PATENT DOCUMENTS

2009/0009864 A1      1/2009   Kobayashi et al.
2015/0262848 A1      9/2015   Sano et al.
                (Continued)

FOREIGN PATENT DOCUMENTS

JP          2007-213016 A      8/2007
JP          2008-014768 A      1/2008
                (Continued)

OTHER PUBLICATIONS

EPO, machine translation of JP 2008014768 A (Year: 2008).*
                (Continued)

*Primary Examiner* — David N Werner
(74) *Attorney, Agent, or Firm* — OSTROLENK FABER LLP

(57)              ABSTRACT

A substrate processing apparatus includes a chamber, a substrate holder, an illuminator, a polarizing filter, a filter driver, a camera, and a controller. The illuminator irradiates an imaging region including a monitoring target in the chamber with illumination light. The filter driver rotates the polarizing filter to a rotation position corresponding to the monitoring target in the imaging region to reduce the unnecessary reflected light corresponding to the monitoring target using the polarizing filter. The camera captures an image of the imaging region through the polarizing filter to generate captured image data. The controller controls the filter driver, and monitors the monitoring target based on the captured image data generated by the camera.

7 Claims, 13 Drawing Sheets

(51) Int. Cl.

| | |
|---|---|
| *H01L 21/67* | (2006.01) |
| *H01L 21/68* | (2006.01) |
| *H01L 21/687* | (2006.01) |
| *H04N 23/72* | (2023.01) |
| *H04N 23/74* | (2023.01) |
| *H04N 23/75* | (2023.01) |

(52) U.S. Cl.
CPC .......... *G06T 7/0002* (2013.01); *G06T 7/0004* (2013.01); *H01L 21/67023* (2013.01); *H01L 21/681* (2013.01); *H01L 21/68764* (2013.01); *H04N 23/72* (2023.01); *H04N 23/74* (2023.01); *H04N 23/75* (2023.01); *G01N 2021/8809* (2013.01); *G01N 2021/8835* (2013.01); *G01N 2021/8848* (2013.01)

(58) Field of Classification Search
CPC ........... G01N 21/8806; G01N 21/8809; G01N 21/8835; G03F 7/7065
See application file for complete search history.

(56) References Cited

U.S. PATENT DOCUMENTS

| | | | | |
|---|---|---|---|---|
| 2016/0116396 A1* | 4/2016 | Hunt | ...................... | G01N 21/94 |
| | | | | 356/369 |
| 2018/0128736 A1* | 5/2018 | Kanamori | .............. | G01N 21/21 |
| 2020/0094370 A1 | 3/2020 | Cherian et al. | | |
| 2021/0080830 A1 | 3/2021 | Kunugimoto et al. | | |
| 2021/0082725 A1* | 3/2021 | Jung | ...................... | G02B 27/30 |
| 2021/0210392 A1 | 7/2021 | Carcasi et al. | | |
| 2022/0048237 A1* | 2/2022 | Laico | .................... | B29C 49/80 |
| 2023/0194438 A1* | 6/2023 | Kurokami | ........ | G01N 21/95607 |
| | | | | 356/237.5 |
| 2023/0204519 A1* | 6/2023 | Allegri | ............... | G01B 11/0608 |
| | | | | 356/237.2 |
| 2024/0280435 A1* | 8/2024 | Lee | .................... | G01M 11/0242 |
| 2025/0012732 A1* | 1/2025 | Honda | ................... | G02B 21/18 |

FOREIGN PATENT DOCUMENTS

| | | | |
|---|---|---|---|
| JP | 2015-173148 | A | 10/2015 |
| JP | 2021-44417 | A | 3/2021 |
| TW | 200944778 | A | 11/2009 |
| TW | 202037908 | A | 8/2020 |

OTHER PUBLICATIONS

International Preliminary Report on Patentability and Written Opinion dated Aug. 22, 2024 in corresponding International Application No. PCT/JP2023/001713 with English translation.

Request for the Submission of an Opinion dated Feb. 18, 2025 in corresponding Korean Patent Application No. 10-2024-7024702 and a computer generated English translation obtained from the JPO.

International Search Report mailed Mar. 14, 2023 in corresponding PCT International Application No. PCT/JP2023/001713.

Written Opinion mailed Mar. 14, 2023 in corresponding PCT International Application No. PCT/JP2023/001713.

Notice of Opinion On Examination and Search Report dated Sep. 20, 2023 in corresponding Taiwanese Patent Application No. 112103788 with English machine language translation made from the Japanese translation of the original communication.

Notice of Reasons for Refusal dated Sep. 16, 2025 in corresponding Japanese Patent Application No. 2022-018670 with English language translation.

Notice of Final Rejection dated Oct. 27, 2025 in corresponding Korean Patent Application No. 10-2024-7024702 with English language translation.

* cited by examiner

F I G. 4
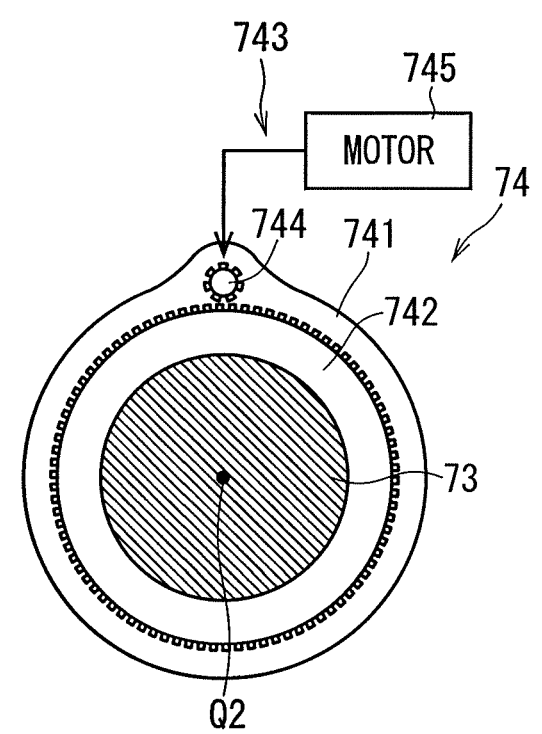
F I G. 5
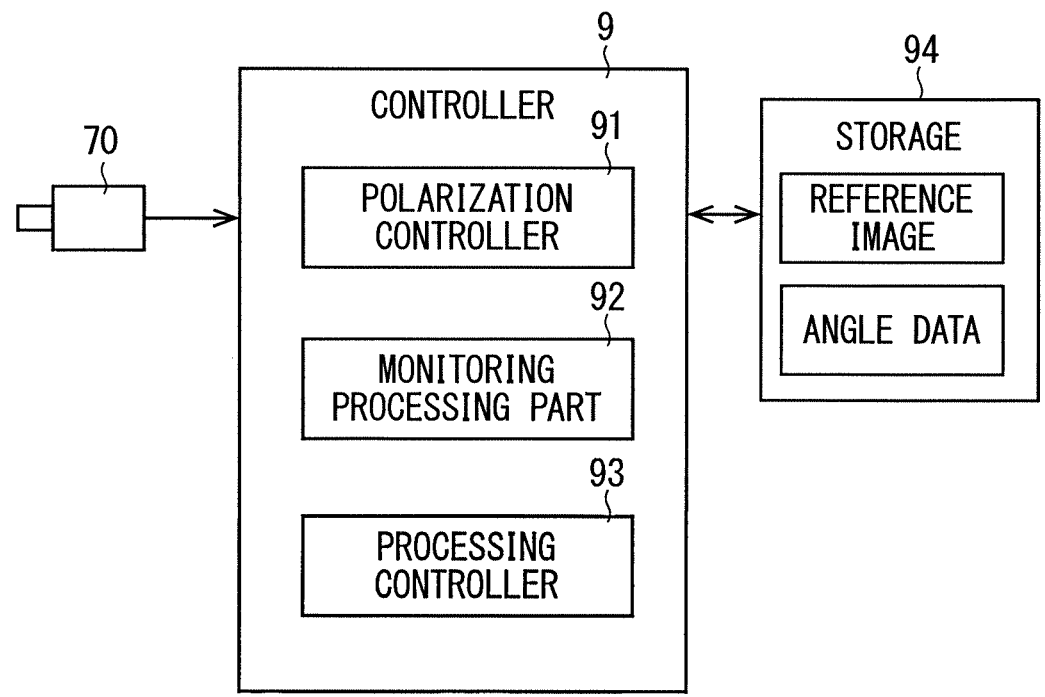

F I G. 6
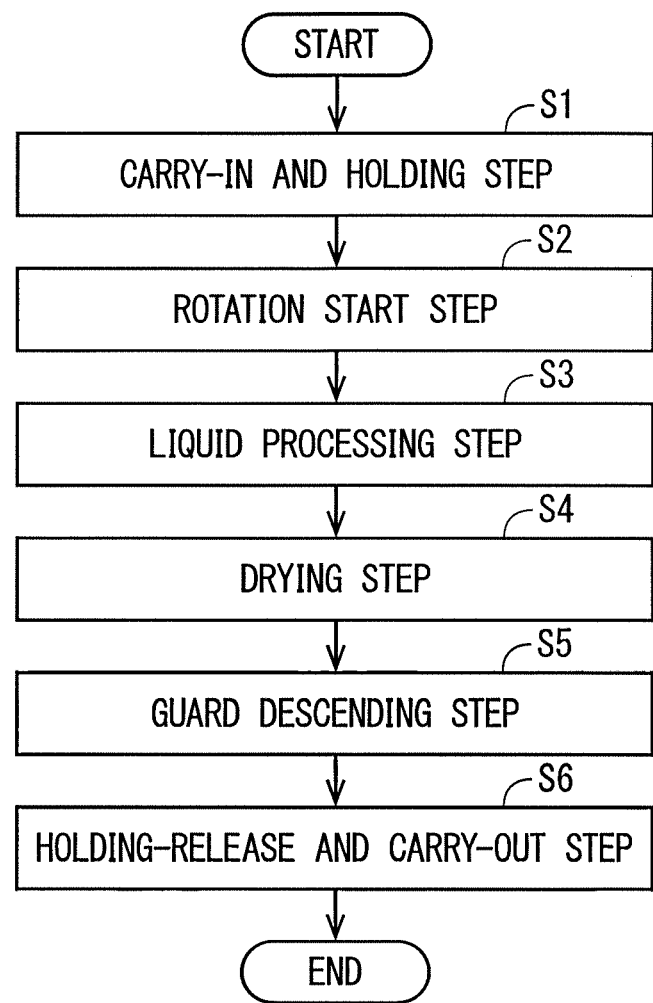

F I G. 9
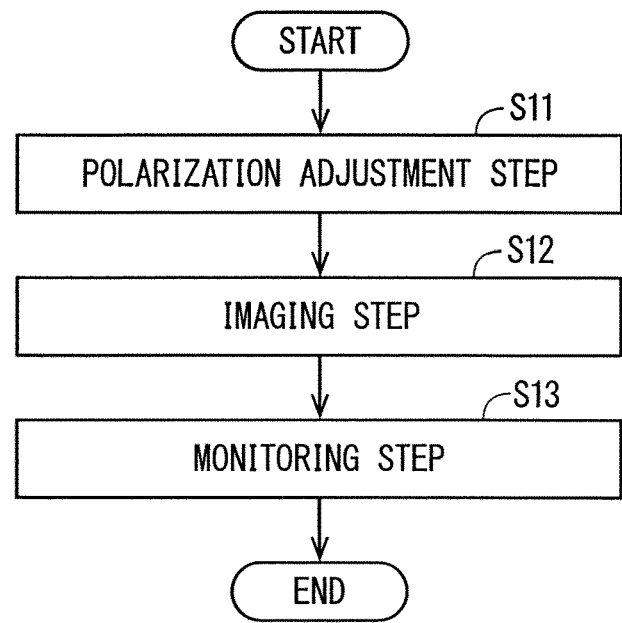
F I G. 10
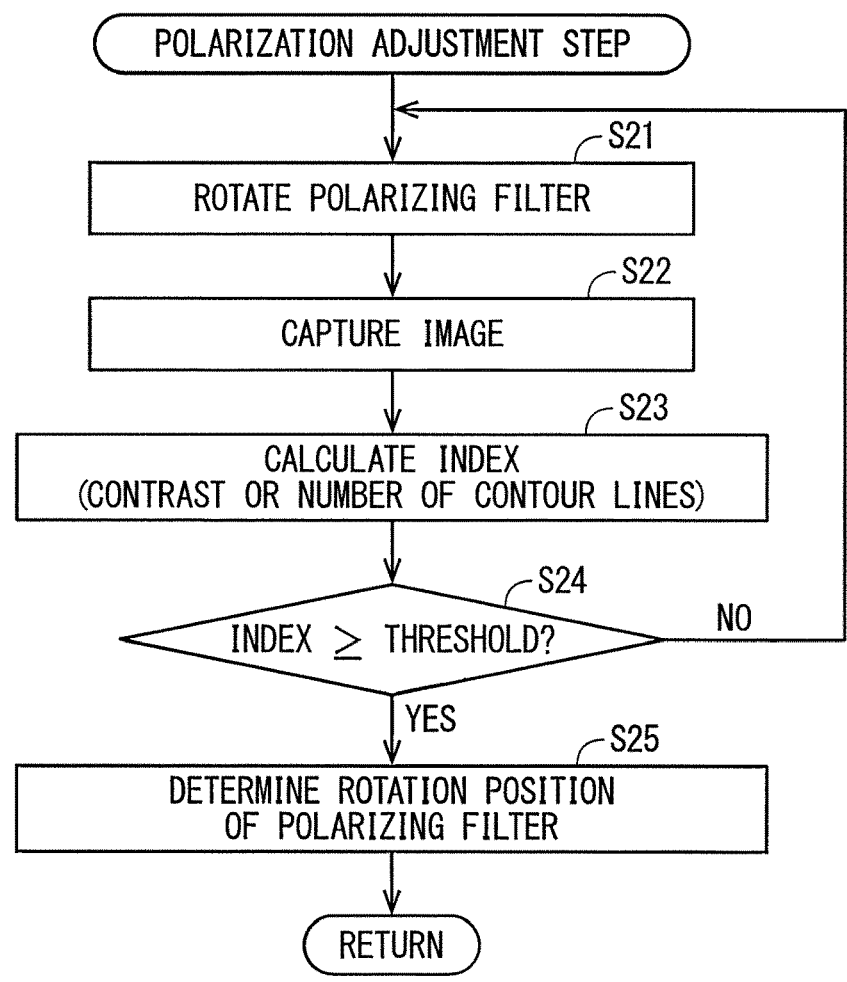

F I G. 1 2
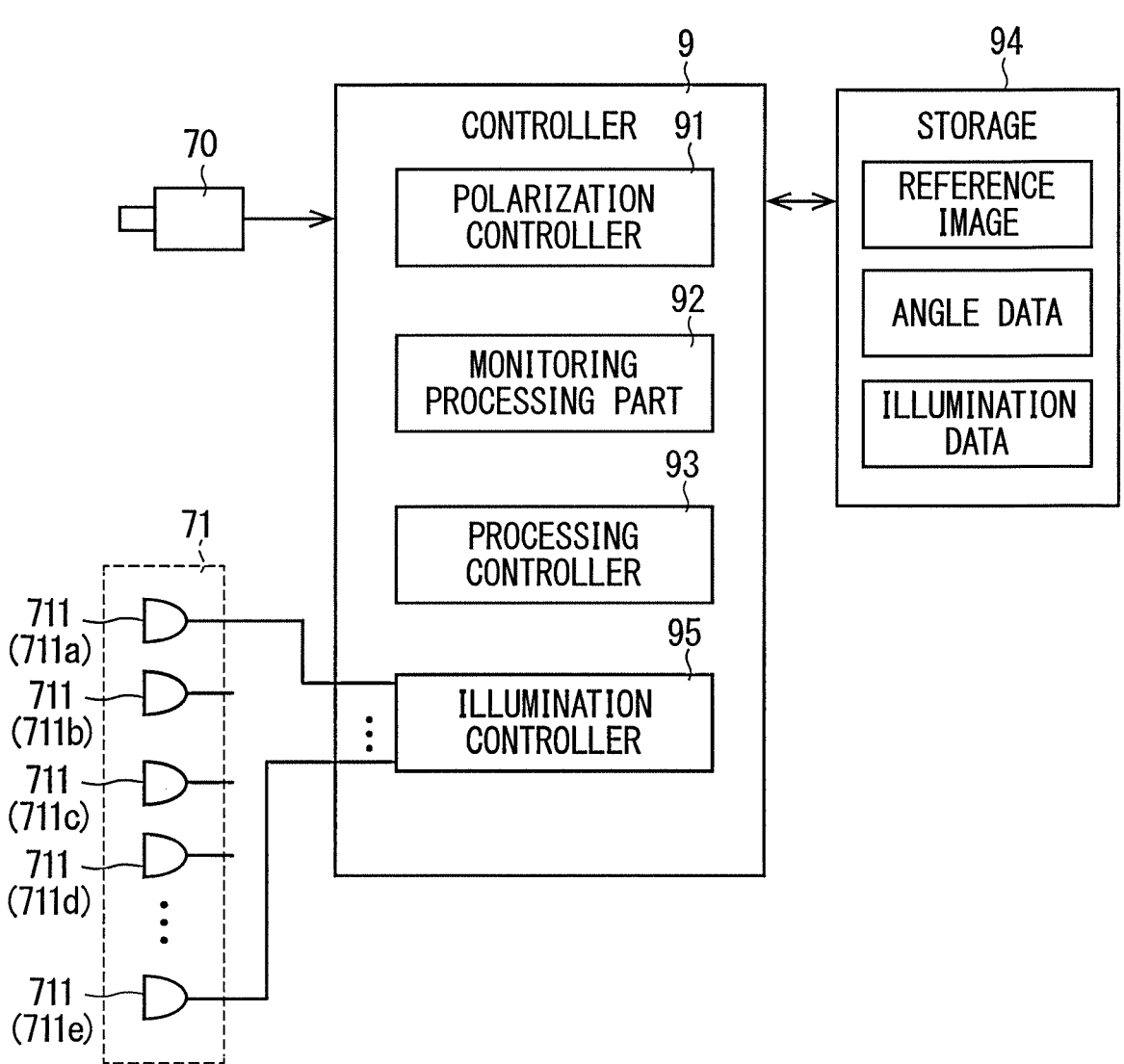

F I G. 13
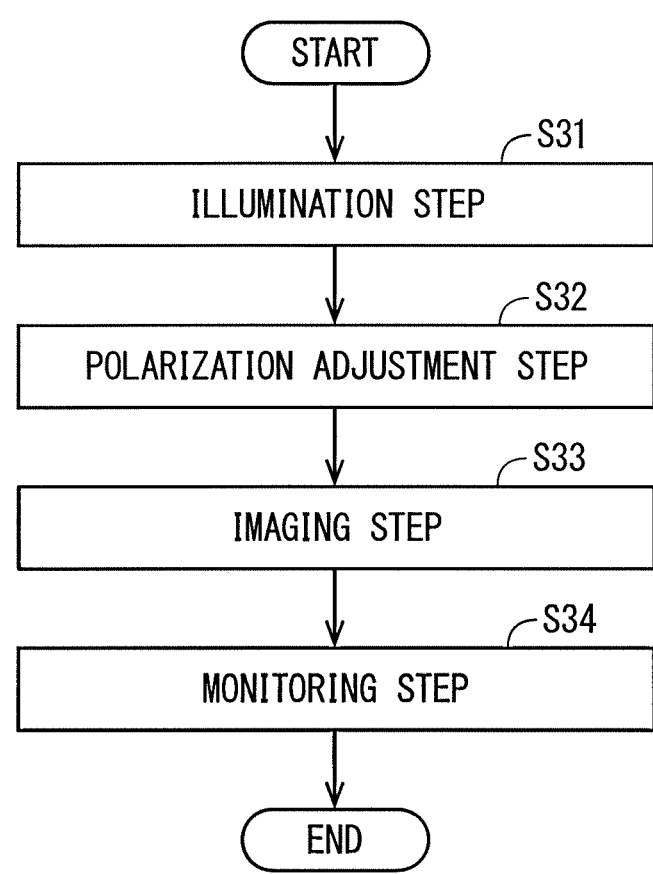

F I G . 1 4
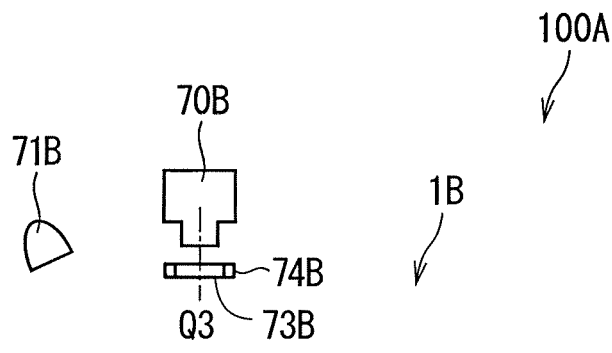
100A
1B
10B
W
15B
21B   20B
22B
30B
31B     31B
41B
40B
42B
DISCHARGE
32B     33B
34B
PROCESSING LIQUID SUPPLY SOURCE
9
CONTROLLER F I G. 15
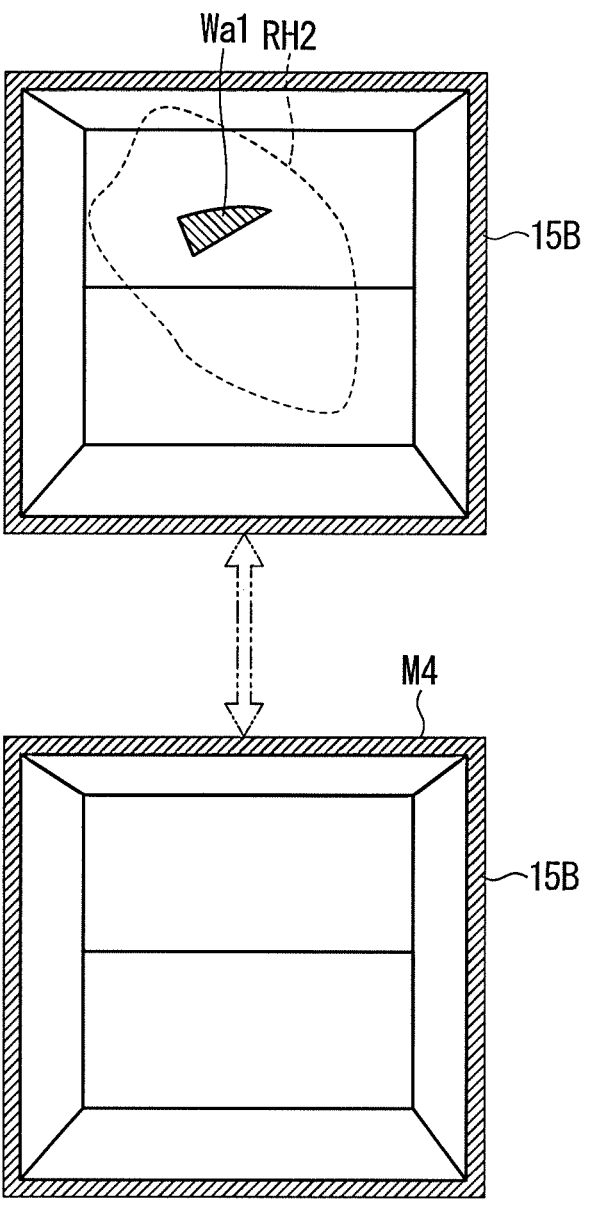

SUBSTRATE PROCESSING APPARATUS AND MONITORING METHOD

CROSS-REFERENCE TO RELATED APPLICATIONS

The present application is a 35 U.S.C. §§ 371 national phase conversion of International Application No. PCT/JP2023/001713, filed Jan. 20, 2023, which claims priority to Japanese Patent Application No. 2022-018670, filed Feb. 9, 2022, the contents of both of which are incorporated herein by reference. The PCT International Application was published in the Japanese language.

TECHNICAL FIELD

The present disclosure relates to a substrate processing apparatus and a monitoring method.

BACKGROUND ART

Conventionally, in a process of manufacturing a semiconductor device or the like, various processing liquids such as pure water, a photoresist liquid, and an etching liquid are supplied to a substrate to perform various pieces of substrate processing such as cleaning processing and resist coating processing. A substrate processing apparatus in which discharges the processing liquid from a nozzle to a surface of the substrate while a substrate holder rotates the substrate in a horizontal posture is widely used as an apparatus performing substrate processing using these processing liquids. For example, the nozzle discharges the processing liquid at a processing position opposite to a center portion of an upper surface of the substrate in a vertical direction. The processing liquid attached to a center portion of the substrate receives centrifugal force accompanying the rotation of the substrate to spread on the surface of the substrate. The processing liquid acts on the surface of the substrate to perform processing on the substrate.

Whether the position of the nozzle is appropriate is monitored in such the substrate processing apparatus. For example, in Patent Document 1, image capturing means such as a camera is provided to monitor the position of the nozzle.

In Patent Document 1, the camera is provided above the substrate holder. The camera captures an image of an imaging region including the substrate and the nozzle held by the substrate holder, and generates a captured image. In Patent Document 1, a reference image including a nozzle is previously set, and the position of the nozzle is detected by matching processing between the captured image captured by the camera and the reference image.

PRIOR ART DOCUMENT

Patent Document

Patent Document 1: Japanese Patent Application Laid-Open No. 2015-173148

SUMMARY

Problem to be Solved by the Invention

In order to more appropriately perform the processing on the substrate, it is desirable to monitor not only the position of the nozzle but also various monitoring targets in the substrate processing apparatus.

For example, the substrate holder includes a disk-shaped spin base provided below the substrate and a plurality of chuck pins erected side by side in a circumferential direction along a peripheral edge of the substrate on an upper surface of the spin base. When the plurality of chuck pins move to a holding position in contact with the peripheral edge of the substrate, the substrate holder can hold the substrate, and when the plurality of chuck pins move to the open position away from the peripheral edge of the substrate, the holding of the substrate is released.

When the chuck pin cannot move to the holding position because of generation of abnormality, the substrate holder cannot normally hold the substrate.

For this reason, it is conceivable that the camera captures the image of the imaging region including the chuck pin to generate captured image data and the image processing part monitors the position of the chuck pin based on the captured image data.

Meanwhile, the camera generates the captured image by incidence of light from the imaging region on the light receiving surface. The captured image includes an image obtained by visualizing reflected light from the imaging region, but some of these pieces of reflected light are unnecessary for monitoring. For example, when intensity of the reflected light from the imaging region is too high, an object in the imaging region is buried in the reflected light, and visibility of the object appearing in the captured image is reduced. As a noticeable example, when the intensity of the reflected light is too high to saturate a pixel value, the image of the object in that region becomes invisible. Such the reflected light having too high intensity has a problem of deteriorating monitoring accuracy.

When a droplet of the processing liquid exists in the imaging region, the reflected light from the droplet is incident on the light receiving surface of the camera, and the droplet also appears in the captured image. For example, when the droplet adheres to the chuck pin, the droplet also appears in the captured image. Such the droplet may also reduce the monitoring accuracy.

As described above, there is a problem that the unnecessary reflected light such as the reflected light having too high intensity and the reflected light of the droplet is incident on the light receiving surface of the camera, whereby the influence of the unnecessary reflected light increases in the captured image, and as a result, the monitoring accuracy decreases.

An object of the present disclosure is to provide a technique capable of monitoring the monitoring target with higher accuracy by reducing the influence of the unnecessary reflected light.

Means to Solve the Problem

A first aspect is a substrate processing apparatus including: a chamber; a substrate holder that holds a substrate; an illuminator that irradiates an imaging region including a monitoring target in the chamber with illumination light; a polarizing filter that transmits light from the imaging region according to a polarization state of the light; a filter driver that rotates the polarizing filter to a rotation position corresponding to the monitoring target to reduce unnecessary reflected light corresponding to the monitoring target using the polarizing filter; a camera that captures an image of the imaging region through the polarizing filter to generate captured image data; and a controller that controls the filter driver and monitors the monitoring target based on the captured image data generated by the camera.

A second aspect is the substrate processing apparatus according to the first aspect further including a storage that previously stores angle data indicating a rotation position of the polarizing filter corresponding to the monitoring target, in which the filter driver rotates the polarizing filter to the rotation position corresponding to the monitoring target based on the angle data.

A third aspect is the substrate processing apparatus according to the first aspect, in which the controller determines the rotation position of the polarizing filter based on a plurality of pieces of captured image data and the plurality of pieces of captured image data is generated by the camera capturing the image of the imaging region while the filter driver sequentially rotates the polarizing filter.

A fourth aspect is the substrate processing apparatus according to the third aspect, in which the controller determines the rotation position based on contrast of each of the plurality of pieces of captured image data or a number of contour lines in each of the plurality of pieces of captured image data.

A fifth aspect is the substrate processing apparatus according to any one of the first to fourth aspects, in which the filter driver rotates the polarizing filter to a first rotation position at which the unnecessary reflected light in a first determination region of the captured image data is reduced, the first determination region is used for monitoring a first monitoring target as the monitoring target, the controller monitors the first monitoring target based on the first determination region of the captured image data generated when the polarizing filter is located at the first rotation position, the filter driver rotates the polarizing filter to a second rotation position at which the unnecessary reflected light in a second determination region of the captured image data is reduced, the second determination region of the captured image data is used for monitoring a second monitoring target as the monitoring target, and the controller monitors the second monitoring target based on the second determination region of the captured image data generated when the polarizing filter is located at the second rotation position.

A sixth aspect is the substrate processing apparatus according to any one of the first to fourth aspects, in which the filter driver rotates the polarizing filter to a first rotation position at which the unnecessary reflected light from a first object is reduced when the first object exists in the imaging region, the controller monitors the monitoring target based on the captured image data generated when the polarizing filter is located at the first rotation position and the first object exists in the imaging region, the filter driver rotates the polarizing filter to a second rotation position at which the unnecessary reflected light from a second object is reduced when the second object exists in the imaging region, and the controller monitors the monitoring target based on the captured image data generated when the polarizing filter is located at the second rotation position and the second object exists in the imaging region.

A seventh aspect is the substrate processing apparatus according to any one of the first to sixth aspects, in which the illuminator is provided vertically above the imaging region, and the camera is provided outside the illuminator with respect to the imaging region in planar view, and captures the image of the imaging region obliquely downward.

An eighth aspect is the substrate processing apparatus according to any one of the first to seventh aspects, in which the illuminator includes a plurality of unit illuminators, and a unit illuminator that emits the illumination light among the plurality of unit illuminators is switched according to the monitoring target so as to enhance an effect of reducing the unnecessary reflected light by the polarizing filter.

A ninth aspect is a monitoring method including: a polarization adjustment step of rotating a polarizing filter that is provided between a camera and an imaging region including a monitoring target in a chamber accommodating a substrate holder holding a substrate and transmits light from the imaging region according to a polarization state of the light to reduce unnecessary reflected light corresponding to the monitoring target using the polarizing filter; an imaging step of generating captured image data by causing the camera to capture an image of the imaging region through the polarizing filter in a state where an illuminator irradiates the imaging region with illumination light; and a monitoring step of monitoring the monitoring target based on the captured image data generated by the camera.

Effects of the Invention

According to the first and ninth aspects, the filter driver rotates the polarizing filter according to the monitoring target to reduce the unnecessary reflected light by the polarizing filter. For this reason, it is possible to reduce the influence of unnecessary reflected light in the captured image data generated by the camera. Accordingly, the controller can monitor the monitoring target with higher accuracy based on the captured image data.

According to the second aspect, the rotation position can be determined by simple processing.

According to the third aspect, it is not necessary to previously set the angle data.

According to the fourth aspect, the contrast and the number of contour lines are increased by reducing the unnecessary reflected light. For this reason, the influence of the unnecessary reflected light in the captured image can be determined by the contrast or the number of contour lines.

According to the fifth aspect, the unnecessary reflected light in the determination region of the monitoring target can be reduced according to the monitoring target, and the monitoring target can be monitored based on the determination region in which the unnecessary reflected light is reduced. Accordingly, the monitoring target can be monitored with high accuracy.

According to the sixth aspect, the unnecessary reflected light corresponding to the object existing in the imaging region is reduced, so that the influence of the unnecessary reflected light in the captured image can be appropriately reduced.

According to the seventh aspect, the effect of reducing the unnecessary reflected light by the polarizing filter can be further enhanced.

According to the eighth aspect, the effect of reducing the unnecessary reflected light by the polarizing filter can be further enhanced according to the monitoring target.

BRIEF DESCRIPTION OF DRAWINGS

FIG. 4 is a view schematically illustrating an example of a configuration of a filter driver.

FIG. 5 is a functional block diagram schematically illustrating an example of an internal configuration of a controller.

FIG. 6 is a flowchart illustrating an example of a flow of substrate processing.

FIG. 9 is a flowchart illustrating an example of monitoring processing.

FIG. 10 is a flowchart illustrating a specific example of a polarization adjustment process.

FIG. 12 is a functional block diagram schematically illustrating an example of an internal configuration of a controller of a processing unit according to another embodiment.

FIG. 13 is a flowchart illustrating an example of monitoring processing according to another embodiment.

FIG. 14 is a view schematically illustrating an example of a configuration of a substrate processing apparatus according to a second embodiment.

FIG. 15 is a view schematically illustrating an example of a captured image.

DESCRIPTION OF EMBODIMENTS

Figure 1:
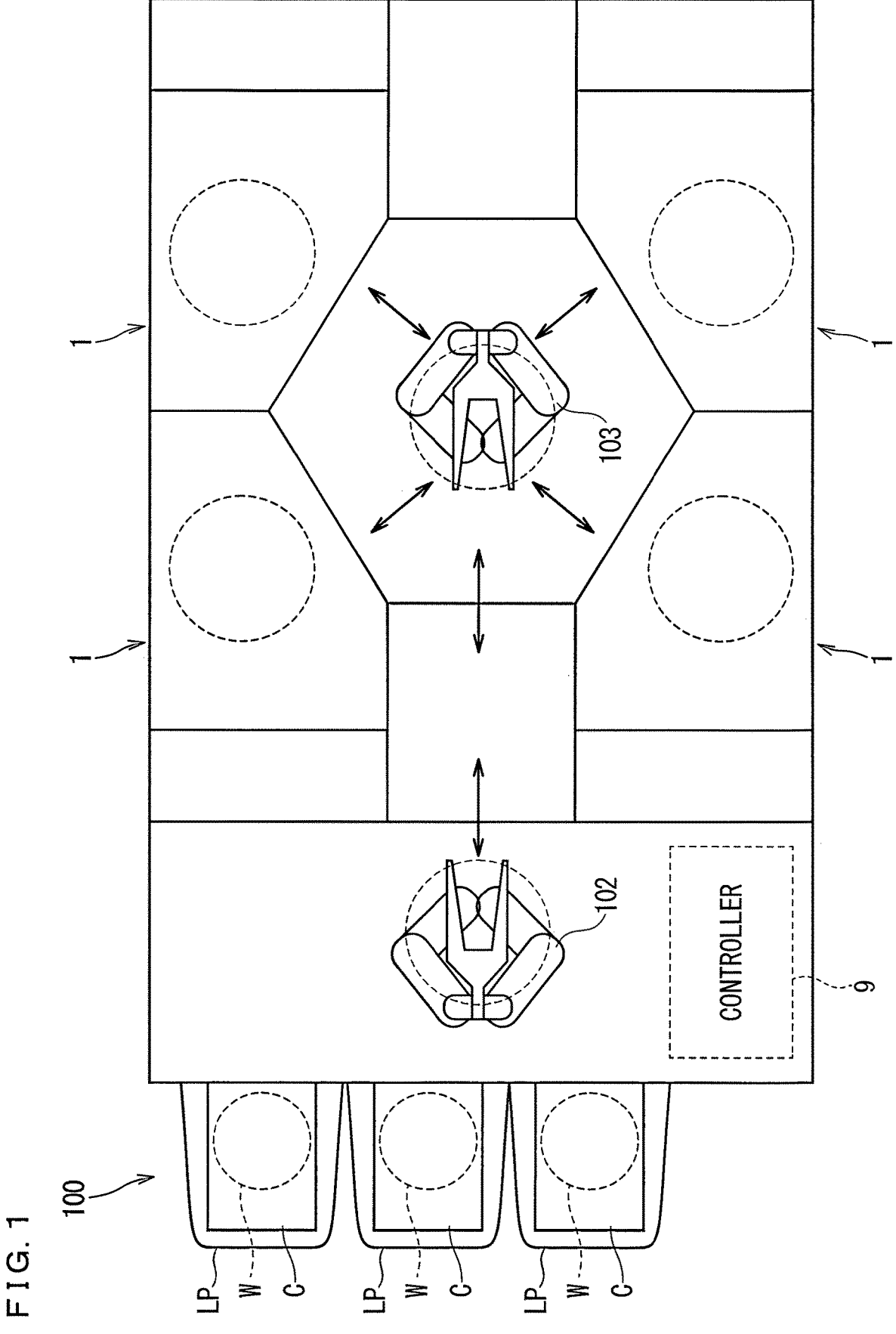
FIG. 1 is a plan view schematically illustrating an example of a configuration of a substrate processing apparatus according to a first embodiment.

Hereinafter, embodiments will be described with reference to the accompanying drawings. The drawings are schematically illustrated, and omission or simplification of a configuration is appropriately made for convenience. A mutual relationship between a size and a position of the configuration illustrated in the drawings is not necessarily described accurately, but can appropriately be changed.

In the following description, the same components are denoted by the same reference numeral, and it is assumed that names and functions of the same components are also similar. Accordingly, the detailed description of the same component is occasionally omitted in order to avoid duplication.

In the following description, even when ordinal numbers such as "first" or "second" are used, these terms are used only for convenience to facilitate understanding of contents of the embodiments, and are not limited to the order that can be generated by these ordinal numbers.

In the case where expressions indicating a relative or absolute positional relationship (for example, "in one direction", "along one direction", "parallel", "orthogonal", "center", "concentric", and "coaxial") are used, the expressions shall not only strictly represent a positional relationship, but also represent a state of being displaced relative to an angle or a distance to an extent that a tolerance or a comparable function is obtained, unless otherwise specified. When expressions indicating an equal state (for example, "same", "equal", and "homogeneous") are used, unless otherwise specified, the expressions shall not only represent a quantitatively strictly equal state, but also represent a state in which there is a difference in obtaining a tolerance or a similar function. In the case where expressions indicating a shape (for example, "quadrangular" or "cylindrical") are used, unless otherwise specified, the expressions shall not only represent the shape geometrically and strictly, but also represent a shape having, for example, unevenness or chamfering within a range in which the same level of effect can be obtained. When expressions "comprising", "owning", "possessing", "including" or "having" one component are used, the expressions are not an exclusive expression excluding presence of other components. When the expression "at least any one of A, B, and C" is used, the expression includes only A, only B, only C, any two of A, B and C, and all of A, B and C.

First Embodiment

<Overall Configuration of Substrate Processing Apparatus>

FIG. 1 is a plan view schematically illustrating an example of a configuration of a substrate processing apparatus 100 according to a first embodiment. The substrate processing apparatus 100 is a single wafer type processing apparatus that processes a substrates W to be processed one by one. The substrate processing apparatus 100 performs liquid processing on the substrate W using a chemical liquid and a rinse liquid such as pure water, and then performs drying processing. For example, the substrate W is a semiconductor substrate and has a disk shape. For example, a mixed solution (SC1) of ammonia and a hydrogen peroxide solution, a mixed aqueous solution (SC2) of hydrochloric acid and a hydrogen peroxide solution, or a DHF solution (dilute hydrofluoric acid) is used as the chemical liquid. In the following description, the chemical liquid, the rinse liquid, an organic solvent, and the like are collectively referred to as a "processing liquid". Not only cleaning processing but also a chemical liquid removing an unnecessary film, the chemical liquid for etching, or the like are included in the "processing liquid".

The substrate processing apparatus 100 includes a plurality of processing units 1, a load port LP, an indexer robot 102, a main conveyance robot 103, and a controller 9.

The load port LP is an interface part that carries in and out the substrate W between the substrate processing apparatus 100 and the outside. A container (also referred to as a carrier) that accommodates a plurality of unprocessed substrates W is carried into the load port LP from the outside. The load port LP can hold a plurality of carriers. As described later, each substrate W is taken out from the carrier by the substrate processing apparatus 100, processed, and accommodated in the carrier again. The carrier that accommodates the plurality of processed substrates W is carried out from the load port LP to the outside.

The indexer robot 102 conveys the substrate W between each carrier held in the load port LP and the main conveyance robot 103. The main conveyance robot 103 conveys the substrate W between each processing unit 1 and the indexer robot 102.

The processing unit 1 performs the liquid processing and the drying processing on one substrate W. In the substrate processing apparatus 100 of the present embodiment, twelve processing units 1 having the same configuration are disposed. Specifically, four towers each including three processing units 1 stacked in a vertical direction are disposed so as to surround a periphery of the main conveyance robot 103. In FIG. 1, one of the processing units 1 that are stacked in three stages is schematically illustrated. The number of processing units 1 in the substrate processing apparatus 100 is not limited to twelve, but may be appropriately changed.

The main conveyance robot 103 is installed at a center of the four towers in which the processing units 1 are stacked. The main conveyance robot 103 carries the substrate W to be processed received from the indexer robot 102 into each processing unit 1. In addition, the main conveyance robot 103 carries out the processed substrate W from each processing unit 1 and transfers the substrate W to the indexer robot 102. The controller 9 controls operation of each component of the substrate processing apparatus 100.

One of the 12 processing units 1 loaded on the substrate processing apparatus 100 will be described below.

<Processing Unit>

Figure 2:
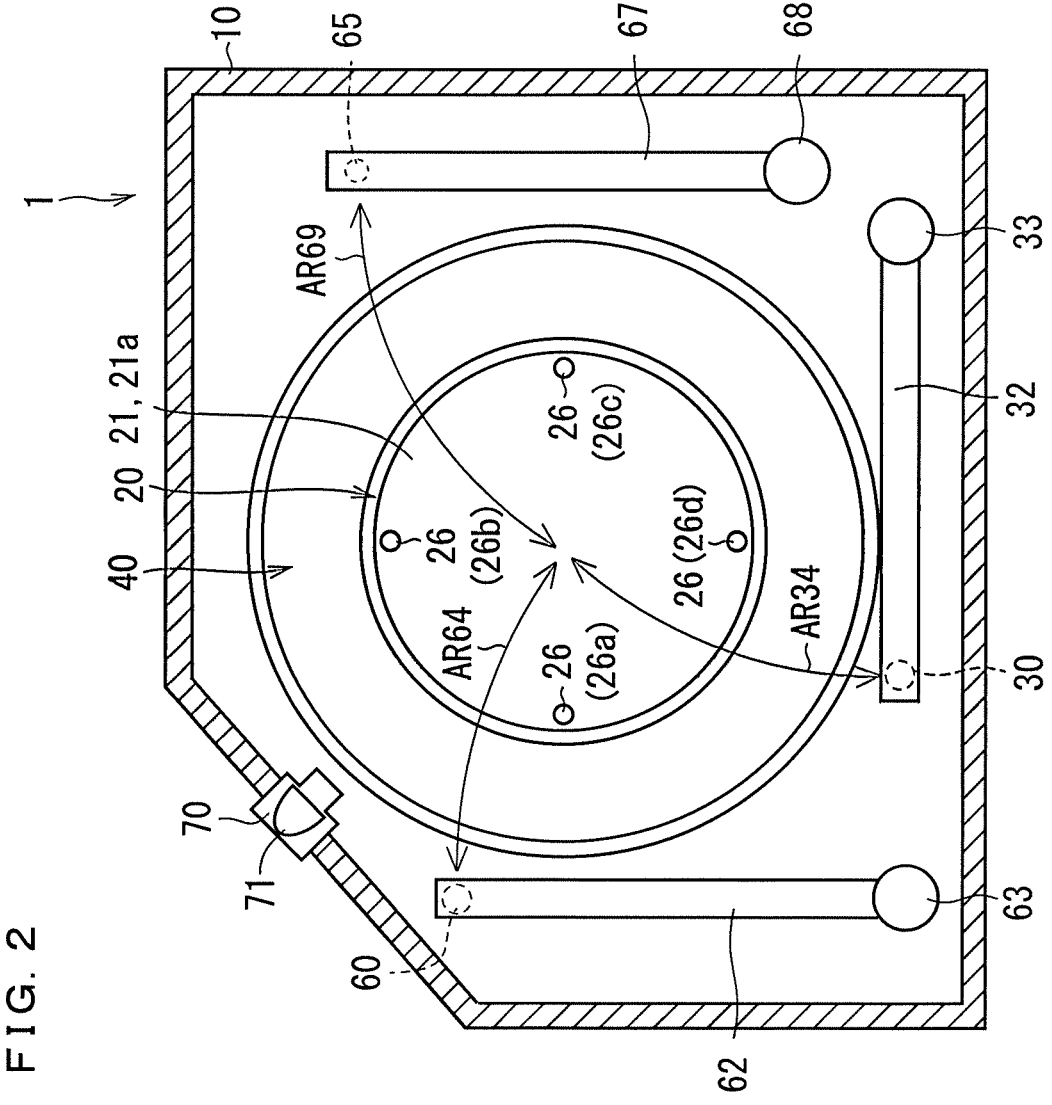
FIG. 2 is a plan view schematically illustrating an example of a configuration of a processing unit according to the first embodiment.
Figure 3:
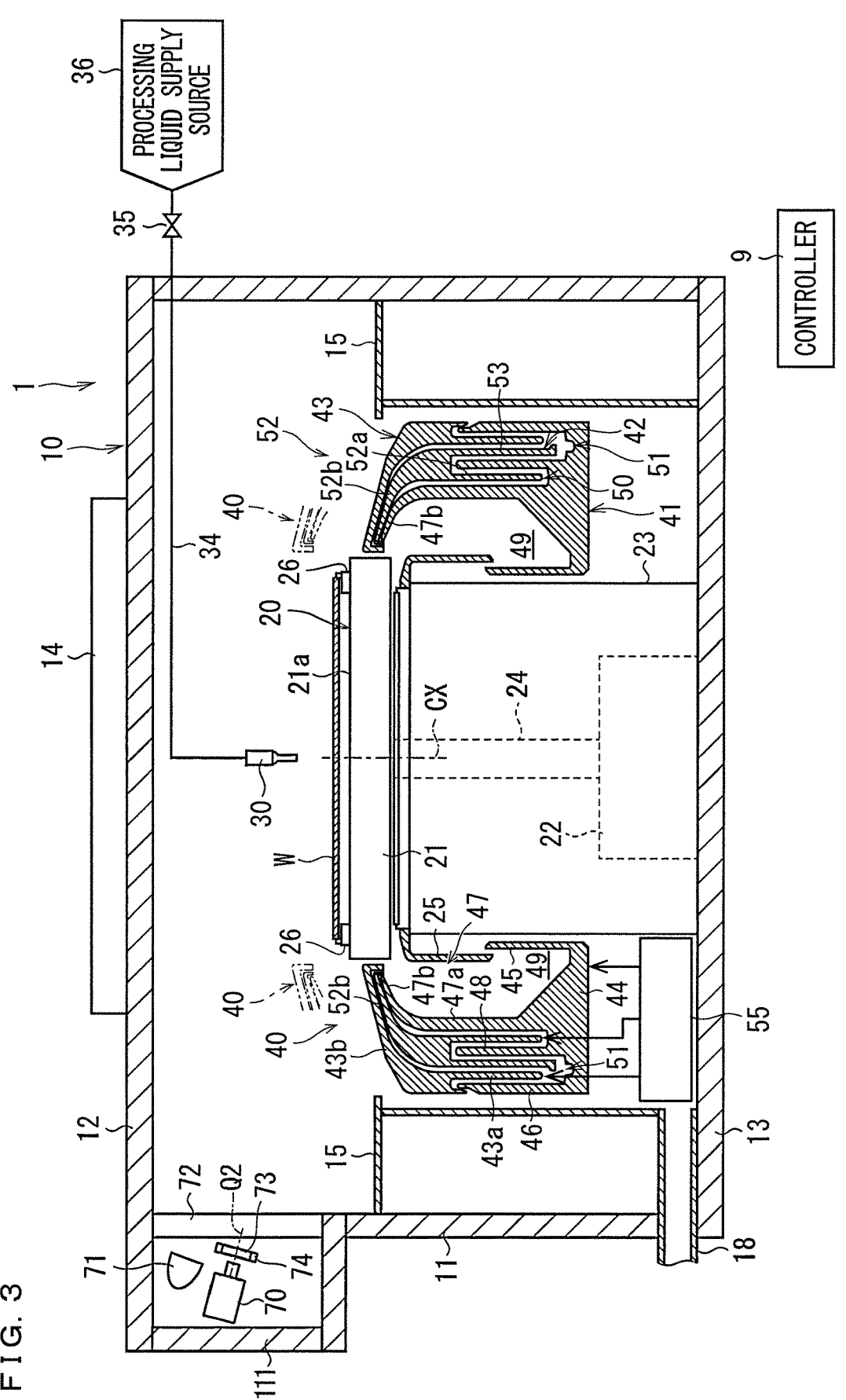
FIG. 3 is a longitudinal sectional view schematically illustrating the example of the configuration of the processing unit according to the first embodiment.

FIG. 2 is a plan view schematically illustrating an example of a configuration of the processing unit 1 according to the first embodiment. FIG. 3 is a longitudinal sectional view schematically illustrating the example of the configuration of the processing unit 1 according to the first embodiment.

In the example of FIGS. 2 and 3, the processing unit 1 includes a substrate holder 20, a first nozzle 30, a second nozzle 60, a third nozzle 65, a guard part 40, a camera 70, a polarizing filter 73, and a filter driver 74.

In the examples of FIGS. 2 and 3, the processing unit 1 also includes a chamber 10. The chamber 10 includes a side wall 11 along the vertical direction, a ceiling wall 12 that closes an upper side of a space surrounded by the side wall 11, and a floor wall 13 that closes a lower side. A processing space is formed in a space surrounded by the side wall 11, the ceiling wall 12, and the floor wall 13. On a part of the side wall 11 of the chamber 10, a carry-in and -out port for the main conveyance robot 103 to carry-in and -out the substrate W and a shutter that opens and closes the carry-in and -out port are provided (both are not illustrated). The chamber 10 accommodates the substrate holder 20, the first nozzle 30, the second nozzle 60, the third nozzle 65, and the guard part 40.

In the example of FIG. 3, a fan filter unit (FFU) 14, which further cleans the air in the clean room where the substrate processing apparatus 100 is installed and supplies the air to the processing space in the chamber 10, is attached to the ceiling wall 12 of the chamber 10. The fan filter unit 14 includes a fan and a filter (for example, a high efficiency particulate air (HEPA) filter) that take in the air in the clean room to send the air into the chamber 10, and forms a down flow of clean air in the processing space in the chamber 10. In order to uniformly disperse the clean air supplied from the fan filter unit 14, a punching plate having a large number of blow-out holes may be provided immediately below the ceiling wall 12.

The substrate holder 20 holds the substrate W in a horizontal posture (posture in which the normal line is along the vertical direction) and rotates the substrate W around a rotation axis CX (see FIG. 3). The rotation axis CX is an axis along the vertical direction and passing through the center portion of the substrate W. The substrate holder 20 is also referred to as a spin chuck. FIG. 2 illustrates the substrate holder 20 in the state where the substrate is not held.

In the examples of FIGS. 2 and 3, the substrate holder 20 includes a disk-shaped spin base 21 provided in a horizontal posture. An outer diameter of the disk-shaped spin base 21 is slightly larger than a diameter of the circular substrate W held by the substrate holder 20 (see FIG. 3). Accordingly, the spin base 21 includes an upper surface 21a opposite to the entire lower surface of the substrate W to be held in the vertical direction.

In the examples of FIGS. 2 and 3, a plurality of (four in the present embodiment) chuck pins 26 are erected on a peripheral edge portion of the upper surface 21a of the spin base 21. The plurality of chuck pins 26 is arranged at equal intervals along a circumference corresponding to the peripheral edge of the circular substrate W. Each of the chuck pins 26 is provided so as to be drivable between a holding position in contact with the peripheral edge of the substrate W and an open position away from the peripheral edge of the substrate W. The plurality of chuck pins 26 are driven in conjunction with each other by a link mechanism (not illustrated) accommodated in the spin base 21. The substrate holder 20 can hold the substrate W in a horizontal posture close to the upper surface 21a above the spin base 21 by stopping the plurality of chuck pins 26 at the respective holding positions (see FIG. 3), and can release the holding of the substrate W by stopping the plurality of chuck pins 26 at the respective opening positions.

In the example of FIG. 3, an upper end of a rotation shaft 24 extending along the rotation axis CX is connected to the lower surface of the spin base 21. A spin motor 22 that rotates the rotation shaft 24 is provided below the spin base 21. The spin motor 22 rotates the spin base 21 in a horizontal plane by rotating the rotation shaft 24 around the rotation axis CX. Consequently, the substrate W held by the chuck pin 26 also rotates around the rotation axis CX.

In the example of FIG. 3, a tubular cover member 23 is provided so as to surround the spin motor 22 and the rotation shaft 24. The lower end of the cover member 23 is fixed to the floor wall 13 of the chamber 10, and the upper end reaches immediately below the spin base 21. In the example of FIG. 3, a flange-shaped member 25, which protrudes substantially horizontally outward from the cover member 23 and further bends and extends downward, is provided in the upper end portion of the cover member 23.

The first nozzle 30 discharges the processing liquid toward the substrate W and supplies the processing liquid to the substrate W. In the example of FIG. 2, the first nozzle 30 is attached to a tip of a nozzle arm 32. The nozzle arm 32 extends horizontally, and a base end thereof is connected to a nozzle support column 33. The nozzle support column 33 extends along the vertical direction and is provided so as to be rotatable around an axis along the vertical direction by an arm driving motor (not illustrated). When the nozzle support column 33 rotates, the first nozzle 30 moves in an arc shape between a nozzle processing position and a nozzle standby position in a space vertically above the substrate holder 20 as indicated by an arrow AR34 in FIG. 2. The nozzle processing position is a position at which the first nozzle 30 discharges the processing liquid onto the substrate W, and for example, is a position opposite to a central portion of the substrate W in the vertical direction. The nozzle standby position is a position at which the first nozzle 30 does not discharge the processing liquid onto the substrate W, and for example, is a position radially outside the peripheral edge of the substrate W. At this point, the radial direction is the radial direction with respect to the rotation axis CX. FIG. 2 illustrates the first nozzle 30 located at the nozzle standby position, and FIG. 3 illustrates the first nozzle 30 located at the nozzle processing position.

As illustrated in FIG. 3, the first nozzle 30 is connected to a processing liquid supply source 36 through a supply pipe 34. The processing liquid supply source 36 includes a tank that stores the processing liquid. A valve 35 is provided in the supply pipe 34. When the valve 35 is opened, the processing liquid is supplied from the processing liquid supply source 36 to the first nozzle 30 through the supply pipe 34, and discharged from a discharge port formed on the lower end surface of the first nozzle 30. The first nozzle 30 may be configured to be supplied with a plurality of kinds of processing liquids (including at least pure water).

The second nozzle 60 is attached to a tip of a nozzle arm 62, and a base end of the nozzle arm 62 is connected to a nozzle support column 63. When the arm driving motor (not illustrated) rotates the nozzle support column 63, the second nozzle 60 moves in an arc shape in a space vertically above the substrate holder 20 as indicated by an arrow AR64. Similarly, a third nozzle 65 is attached to a tip of a nozzle arm 67, and the proximal end of the nozzle arm 67 is connected to a nozzle support column 68. When the arm driving motor (not illustrated) rotates the nozzle support column 68, the third nozzle 65 moves in an arc shape in the space vertically above the substrate holder 20 as indicated by an arrow AR69.

Similarly to the first nozzle 30, each of the second nozzle 60 and the third nozzle 65 is connected to a processing liquid supply source (not illustrated) through a supply pipe (not illustrated). A valve is provided in each supply pipe, and supply and stop of the processing liquid is switched by opening and closing the valve. The number of nozzles provided in the processing unit 1 is not limited to three, but may be at least one.

In the liquid processing, for example, the processing unit 1 causes the first nozzle 30 to discharge the processing liquid toward the upper surface of the substrate W while rotating the substrate W by the substrate holder 20. The processing liquid attached to the upper surface of the substrate W spreads on the upper surface of the substrate W by receiving centrifugal force accompanying the rotation, and scatters from the peripheral edge of the substrate W. By this liquid processing, processing according to the kind of the processing liquid can be performed on the upper surface of the substrate W.

The guard part 40 is a member that receives the processing liquid scattered from the peripheral edge of the substrate W. The guard part 40 has a tubular shape surrounding the substrate holder 20, and for example, includes a plurality of guards that can ascend and descend independently of each other. The guard may also be referred to as a processing cup. In the example of FIG. 3, an inner guard 41, a middle guard 42, and an outer guard 43 are illustrated as the plurality of guards. Each of the guards 41 to 43 surrounds the periphery of the substrate holder 20 and has a shape substantially rotationally symmetric with respect to the rotation axis CX.

In the example of FIG. 3, the inner guard 41 integrally includes a bottom part 44, an inner wall part 45, an outer wall part 46, a first guide part 47, and a middle wall part 48. The bottom part 44 has an annular shape in planar view. The inner wall part 45 and the outer wall part 46 have a cylindrical shape, and are erected on an inner peripheral edge and an outer peripheral edge of the bottom part 44, respectively. The first guide part 47 includes a tubular part 47a erected on the bottom part 44 between the inner wall part 45 and the outer wall part 46 and an inclined part 47b that approaches the rotation axis CX as it goes vertically upward from the upper end of the tubular part 47a. The middle wall part 48 has a cylindrical shape, and is erected on the bottom part 44 between the first guide part 47 and the outer wall part 46.

In the state where the guards 41 to 43 are raised (see an imaginary line in FIG. 3), the processing liquid scattered from the peripheral edge of the substrate W is received by the inner peripheral surface of the first guide part 47, flows down along the inner peripheral surface, and is received by a disposal groove 49. The disposal groove 49 is an annular groove formed by the inner wall part 45, the first guide part 47, and the bottom part 44. An exhaust liquid mechanism (not illustrated), which discharges the processing liquid and forcibly exhausts the inside of the disposal groove 49, is connected to the disposal groove 49.

The middle guard 42 integrally includes a second guide part 52 and a cylindrical processing liquid separation wall 53 connected to the second guide part 52. The second guide part 52 includes a tubular part 52a having a cylindrical shape and an inclined part 52b that approaches the rotation axis CX as it goes vertically upward from the upper end of the tubular part 52a. The inclined part 52b is located vertically above the inclined part 47b of the inner guard 41, and provided so as to overlap the inclined part 47b in the vertical direction. The tubular part 52a is accommodated in an annular inside recovery groove 50. The inside recovery groove 50 is a groove formed by the first guide part 47, the middle wall part 48, and the bottom part 44.

In the state where only the guards 42, 43 are raised, the processing liquid from the peripheral edge of the substrate W is received by the inner peripheral surface of the second guide part 52, flows down along the inner peripheral surface, and is received by the inside recovery groove 50.

The processing liquid separation wall 53 has a cylindrical shape, and an upper end thereof is connected to the second guide part 52. The processing liquid separation wall 53 is accommodated in the annular outside recovery groove 51. The outside recovery groove 51 is a groove formed by the middle wall part 48, the outer wall part 46, and the bottom part 44.

The outer guard 43 is located outside the middle guard 42, and has a function as a third guide part that guides the processing liquid to the outside recovery groove 51. The outer guard 43 integrally includes a cylindrical tubular part 43a and an inclined part 43b approaching the rotation axis CX as it goes vertically upward from the upper end of the tubular part 43a. The tubular part 43a is accommodated in the outside recovery groove 51, and the inclined part 43b is located vertically above the inclined part 52b and provided so as to vertically overlap the inclined part 52b.

In the state where only the outer guard 43 is raised, the processing liquid from the peripheral edge of the substrate W is received by the inner peripheral surface of the outer guard 43, flows down along the inner peripheral surface, and is received by the outside recovery groove 51.

The inside recovery groove 50 and the outside recovery groove 51 are connected to a recovery mechanism (not illustrated) that recovers the processing liquid in a recovery tank provided outside the processing unit 1.

The guards 41 to 43 can be ascended and descended by a guard ascending and descending mechanism 55. The guard ascending and descending mechanism 55 ascends and descends the guards 41 to 43 between a guard processing position and a guard standby position such that the guards 41 to 43 do not collide with each other. The guard processing position is a position where the upper-end peripheral edge portion of the target guard to be ascended and descended is located above the upper surface of the substrate W, and the guard standby position is a position where the upper-end peripheral edge portion of the target guard is located below the upper surface 21a of the spin base 21. At this point, the upper-end peripheral edge portion is an annular portion that forms an upper-end opening of the target guard. In the example of FIG. 3, the guards 41 to 43 are located at the guard standby position. For example, the guard ascending and descending mechanism 55 includes a ball screw mechanism and a motor or an air cylinder.

A partition plate 15 is provided so as to vertically partition an inside space of the chamber 10 around the guard part 40. A through-hole and a notch (not illustrated) penetrating in the thickness direction of the partition plate 15 may be formed, and in the present embodiment, a through-hole passing the nozzle support column 33, the nozzle support column 63, and the nozzle support column 68 is made. An outer peripheral end of the partition plate 15 is connected to the side wall 11 of the chamber 10. An inner peripheral edge of the partition plate 15 surrounding the guard part 40 is formed in a circular shape having a diameter larger than the outer diameter of the outer guard 43. Accordingly, the partition plate 15 does not obstruct the ascent and descent of the outer guard 43.

In the example of FIG. 3, an exhaust duct 18 is provided in a part of the side wall 11 of the chamber 10 and in the vicinity of the floor wall 13. The exhaust duct 18 is communicably connected to an exhaust mechanism (not illustrated). In the clean air flowing down in the chamber 10, the air passing between the guard part 40 and the partition plate 15 is discharged from the exhaust duct 18 to the outside of the apparatus.

The camera 70 is used to monitor the state of a monitoring target in the chamber 10. For example, the monitoring target includes at least one of the substrate holder 20, the first nozzle 30, the second nozzle 60, the third nozzle 65, and the guard part 40. The camera 70 captures an image of an imaging region including the monitoring target to generate captured image data (hereinafter, simply referred to as a captured image), and outputs the captured image to the controller 9. As will be described in detail later, the controller 9 monitors the state of the monitoring target based on the captured image.

The camera 70 includes a solid-state imaging element such as a charge coupled device (CCD) or a complementary metal oxide semiconductor (CMOS) and an optical system such as a lens. In the example of FIG. 3, the camera 70 is installed at an imaging position vertically above the substrate W held by the substrate holder 20. In the example of FIG. 3, the imaging position is set vertically above the partition plate 15 and radially outside with respect to the guard part 40. At this point, the radial direction is the radial direction with respect to the rotation axis CX.

In the example of FIG. 3, a concave part (hereinafter, referred to as a recessed wall part 111) accommodating the camera 70 is formed on the side wall 11 of the chamber 10. The recessed wall part 111 has a shape recessed outward with respect to other parts of the side wall 11. The camera 70 is accommodated inside the recessed wall part 111. In the example of FIG. 3, a transparent member 72 is provided in front of the camera 70 in an imaging direction. The transparent member 72 has high translucency with respect to a wavelength of light detected by the camera 70. For this reason, the camera 70 can capture the image of the imaging region in the processing space through the transparent member 72. In other words, the transparent member 72 is provided between the camera 70 and the imaging region. For example, transmittance of the transparent member 72 in the detection wavelength range of the camera 70 is equal to or greater than 60%, preferably equal to or greater than 80%. For example, the transparent member 72 is made of a transparent material such as quartz glass. In the example of FIG. 3, the transparent member 72 has a plate shape, and forms an accommodation space of the camera 70 together with the recessed wall part 111 of the side wall 11. When the transparent member 72 is provided, the camera 70 can be protected from the processing liquid and a volatile component of the processing liquid in the processing space.

For example, the imaging region of the camera 70 includes parts of the substrate holder 20 and the guard part 40. In the example of FIG. 3, the camera 70 captures the image of the imaging region obliquely downward from the imaging position. In other words, the imaging direction of the camera 70 is inclined vertically downward from the horizontal direction.

In the example of FIG. 3, an illuminator 71 is provided at a position vertically above the partition plate 15. In the example of FIG. 3, the illuminator 71 is provided radially outside the guard part 40 in planar view, and is provided inside the recessed wall part 111 as a more specific example. The illuminator 71 includes a light source such as a light emitting diode and irradiates the imaging region with irradiation light. In the case where the inside of the chamber 10 is a dark room, the controller 9 may control the illuminator 71 such that the illuminator 71 irradiates the imaging region when the camera 70 captures the image. Illumination light from the illuminator 71 is transmitted through the transparent member 72 and emitted into the processing space.

The polarizing filter 73 is provided between the camera 70 and the imaging region. In the example of FIG. 3, the polarizing filter 73 is also provided inside the recessed wall part 111. The polarizing filter 73 transmits light from the imaging region according to a polarization state of the light. Specifically, an absorption axis and a polarization axis of the polarizing filter 73 are orthogonal to each other, and the polarizing filter 73 absorbs a polarized component along the absorption axis in the light incident on itself and transmits the polarized component along the polarization axis. The polarizing filter 73 may be a circularly polarizing filter. The light reflected by the imaging region enters a light receiving surface of the camera 70 through the polarizing filter 73. That is, the camera 70 captures the image of the imaging region through the polarizing filter 73.

The filter driver 74 rotates the polarizing filter 73 around a rotation axis Q2 along the optical axis thereof. Consequently, the absorption axis of the polarizing filter 73 rotates around the rotation axis Q2. In the example of FIG. 3, the rotation axis Q2 is also a direction along the imaging direction of the camera 70.

FIG. 4 is a view schematically illustrating an example of a configuration of the filter driver 74. The filter driver 74 includes a case 741, a rotation holding member 742, and a rotation mechanism 743. The case 741 has a ring-shaped outer shape surrounding the rotation axis Q2. The rotation holding member 742 holds the peripheral edge of the polarizing filter 73 and is accommodated in the case 741 so as to be rotatable around the rotation axis Q2. The rotation mechanism 743 rotates the rotation holding member 742 with respect to the case 741. In the example of FIG. 4, the rotation mechanism 743 includes a power transmission mechanism 744 and a motor 745. The motor 745 is controlled by the controller 9. The motor 745 transmits rotational force to the rotation holding member 742 through the power transmission mechanism 744 to rotate the rotation holding member 742 with respect to the case 741. For example, the power transmission mechanism 744 includes an external gear meshing with a plurality of tooth shapes formed on the outer peripheral surface of the rotation holding member 742, and the rotation holding member 742 meshing with the external gear rotates when the motor 745 rotates the external gear. When the rotation mechanism 743 rotates the rotation holding member 742, the polarizing filter 73 held by the rotation holding member 742 rotates around the rotation axis Q2.

As will be described later, the filter driver 74 rotates the polarizing filter 73 around the rotation axis Q2 according to unnecessary reflected light from the imaging region, and reduces the unnecessary reflected light by the polarizing filter 73. The unnecessary reflected light mentioned here is reflected light from the imaging region, and is reflected light that causes degradation in monitoring accuracy of the monitoring target. A specific example of the unnecessary reflected light will be described later.

A hardware configuration of the controller 9 is the same as that of a general computer. That is, the controller 9 includes a data processing part such as a CPU that performs various kinds of arithmetic processing, a non-temporary storage part such as a read only memory (ROM) that is a read-only memory storing a basic program, and a temporary storage part such as a random access memory (RAM) that is a readable and writable memory storing various kinds of information. When the CPU of the controller 9 executes a predetermined processing program, each operation mechanism of the substrate processing apparatus 100 is controlled by the controller 9, and the processing in the substrate processing apparatus 100 proceeds. The controller 9 may be implemented by a dedicated hardware circuit that does not need software implementing a function of the controller 9.

FIG. 5 is a functional block diagram schematically illustrating an example of an internal configuration of the controller 9. As illustrated in FIG. 5, the controller 9 includes a polarization controller 91, a monitoring processing part 92, and a processing controller 93.

The polarization controller 91 outputs a control signal to the filter driver 74 (more specifically, the motor 745), and causes the filter driver 74 to rotate the polarizing filter 73. A detailed operation of the polarization controller 91 will be described later.

The monitoring processing part 92 monitors the state of the monitoring target based on the captured image from the camera 70. The detailed operation of the monitoring processing part 92 will also be described later.

The processing controller 93 controls each component of the processing unit 1. More specifically, the processing controller 93 controls the spin motor 22, various valves such as and the valve 35, the arm driving motor that rotates each of the nozzle support columns 33, 63, 68, the guard ascending and descending mechanism 55, the fan filter unit 14, and the camera 70. The processing controller 93 controls these configurations according to a predetermined procedure, so that the processing unit 1 can perform processing on the substrate W.

<Example of Flow of Substrate Processing>

An example of a specific flow of processing for the substrate W will be briefly described below. FIG. 6 is a flowchart illustrating an example of a flow of substrate processing. Initially, the guards 41 to 43 stop at the guard standby position, and the nozzles 30, 60, 65 stop at the nozzle standby position. Although the controller 9 controls each configuration to execute a predetermined operation to be described later, each configuration itself will be adopted and described below as a subject of the operation. First, the main conveyance robot 103 carries the unprocessed substrate W in the processing unit 1, and the substrate holder 20 holds the substrate W (step S1: carry-in and holding step). Because the guard part 40 is initially stopped at the guard standby position, collision between a hand of the main conveyance robot 103 and the guard part 40 can be avoided when the substrate W is carried in. When the substrate W is passed to the substrate holder 20, the plurality of chuck pins 26 move to the respective holding positions, whereby the plurality of chuck pins 26 holds the substrate W.

Subsequently, the spin motor 22 starts the rotation of the substrate W (step S2: rotation start step). Specifically, the spin motor 22 rotates the spin base 21 to rotate the substrate W held by the substrate holder 20.

Subsequently, the processing unit 1 performs various kinds of liquid processing on the substrate W (step S3: liquid processing step). For example, the processing unit 1 performs chemical liquid processing. First, the guard ascending and descending mechanism 55 ascends the guard corresponding to the chemical liquid in the guards 41 to 43 to the guard processing position. The guard for the chemical liquid is not particularly limited, but for example, may be the outer guard 43. In this case, the guard ascending and descending mechanism 55 stops the inner guard 41 and the middle guard 42 at the guard standby positions, and ascends the outer guard 43 to the guard processing position.

Subsequently, the processing unit 1 supplies the chemical liquid to the substrate W. At this point, it is assumed that the first nozzle 30 supplies the processing liquid. Specifically, the arm driving motor moves the first nozzle 30 to the nozzle processing position, and the valve 35 is open to discharge the chemical liquid from the first nozzle 30 toward the substrate W. Consequently, the chemical liquid spreads over the upper surface of the rotating substrate W and scatters from the peripheral edge of the substrate W. At this point, the chemical liquid acts on the upper surface of the substrate W, and the processing (for example, cleaning processing) corresponding to the chemical liquid is performed on the substrate W. The chemical liquid scattered from the peripheral edge of the substrate W is received by the inner peripheral surface of the guard part 40 (for example, the outer guard 43). When the chemical liquid processing is sufficiently performed, the processing unit 1 stops the supply of the chemical liquid.

Subsequently, the processing unit 1 performs rinse processing on the substrate W. The guard ascending and descending mechanism 55 adjusts an ascending and descending state of the guard part 40 as necessary. That is, when the guard for the rinse liquid is different from the guard for the chemical liquid, the guard ascending and descending mechanism 55 moves the guard corresponding to the rinse liquid in the guards 41 to 43 to the guard processing position. The guard for the rinse liquid is not particularly limited, but may be the inner guard 41. In this case, the guard ascending and descending mechanism 55 ascends the guards 41 to 43 to the respective guard processing positions.

Subsequently, the first nozzle 30 discharges a first rinse liquid toward the upper surface of the substrate W. For example, the first rinse liquid is the pure water. The first rinse liquid spreads over the upper surface of the rotating substrate W, and scatters from the peripheral edge of the substrate W while pushing away the chemical liquid on the substrate W. The processing liquid (mainly the rinse liquid) scattered from the peripheral edge of the substrate W is received by the inner peripheral surface of the guard part 40 (for example, the inner guard 41). When the rinse processing is sufficiently performed, the processing unit 1 stops the supply of the first rinse liquid.

The processing unit 1 may supply a volatile second rinse liquid such as isopropyl alcohol having high volatility to the substrate W as necessary. When the guard for the second rinse liquid is different from the guard for the first rinse liquid described above, the guard ascending and descending mechanism 55 may move the guard corresponding to the second rinse liquid in the guards 41 to 43 to the guard processing position. When the rinsing processing is completed, the first nozzle 30 moves to the nozzle standby position.

Subsequently, the processing unit 1 performs drying processing on the substrate W (step S4: drying step). For example, the spin motor 22 increases the rotation speed of the substrate W to dry the substrate W (what is called spin dry). Also in the drying processing, the processing liquid scattered from the peripheral edge of the substrate W is received by the inner peripheral surface of the guard part 40. When the drying processing is sufficiently performed, the spin motor 22 stops the rotation of the substrate W.

Subsequently, the guard ascending and descending mechanism 55 descends the guard part 40 to the guard standby position (step S5: guard descending step). That is, the guard ascending and descending mechanism 55 descends each of the guards 41 to 43 to the guard standby position.

Subsequently, the substrate holder 20 releases the holding of the substrate W, and the main conveyance robot 103 takes out the processed substrate W from the processing unit 1 (step S6: holding-release and carry-out step). The guard part 40 is stopped at the guard standby position when the substrate W is carried out, so that the collision between the hand of the main conveyance robot 103 and the guard part 40 can be avoided.

As described above, the various components in the processing unit 1 are appropriately operated to process the substrate W. For example, the substrate holder 20 holds or releases the substrate W. The first nozzle 30 moves between the nozzle processing position and the nozzle standby position, and discharges the processing liquid toward the substrate W at the nozzle processing position. Each of the guards 41 to 43 of the guard part 40 moves to a height position corresponding to each step.

<Monitoring Processing>

When these components cannot be appropriately operated, the processing for the substrate W becomes inappropriate. Accordingly, in the present embodiment, the processing unit 1 monitors at least one of the above-described components as the monitoring target based on the captured image from the camera 70.

For example, in a carry-in and holding step (step S1), when the guard part 40 does not moved to the guard standby position, the hand of the main conveyance robot 103 may collide with the guard part 40 when the substrate W is carried in. Accordingly, it is desirable to monitor the position of the guard part 40 in the carry-in and holding step.

For example, when the chuck pin 26 cannot move to the holding position after the substrate W is carried in in the carry-in and holding step, the substrate holder 20 cannot appropriately hold the substrate W. Thus, it is also desirable to monitor the position of the chuck pin 26 of the substrate holder 20 after the substrate W is carried in in the carry-in and holding step.

For example, when the first nozzle 30 cannot appropriately discharge the processing liquid in the liquid processing step (step S3), excess or deficiency may be generated in the processing for the substrate W. Thus, it is also desirable to monitor the discharge state of the first nozzle 30 in the liquid processing step.

For example, in the liquid processing step, when the guard part 40 cannot appropriately move to the guard processing position, the guard corresponding to the processing liquid cannot receive the processing liquid. Accordingly, it is also desirable to monitor the position of guard part 40 in the liquid processing step.

Furthermore, for example, when the guard part 40 does not appropriately move to the guard standby position in the guard descending step (step S5), there is a possibility that the hand of the main conveyance robot 103 collides with the guard part 40 in the subsequent holding-release and carry-out step (step S6). Accordingly, it is also desirable to monitor the position of the guard part 40 in the guard descending step.

Figure 7:
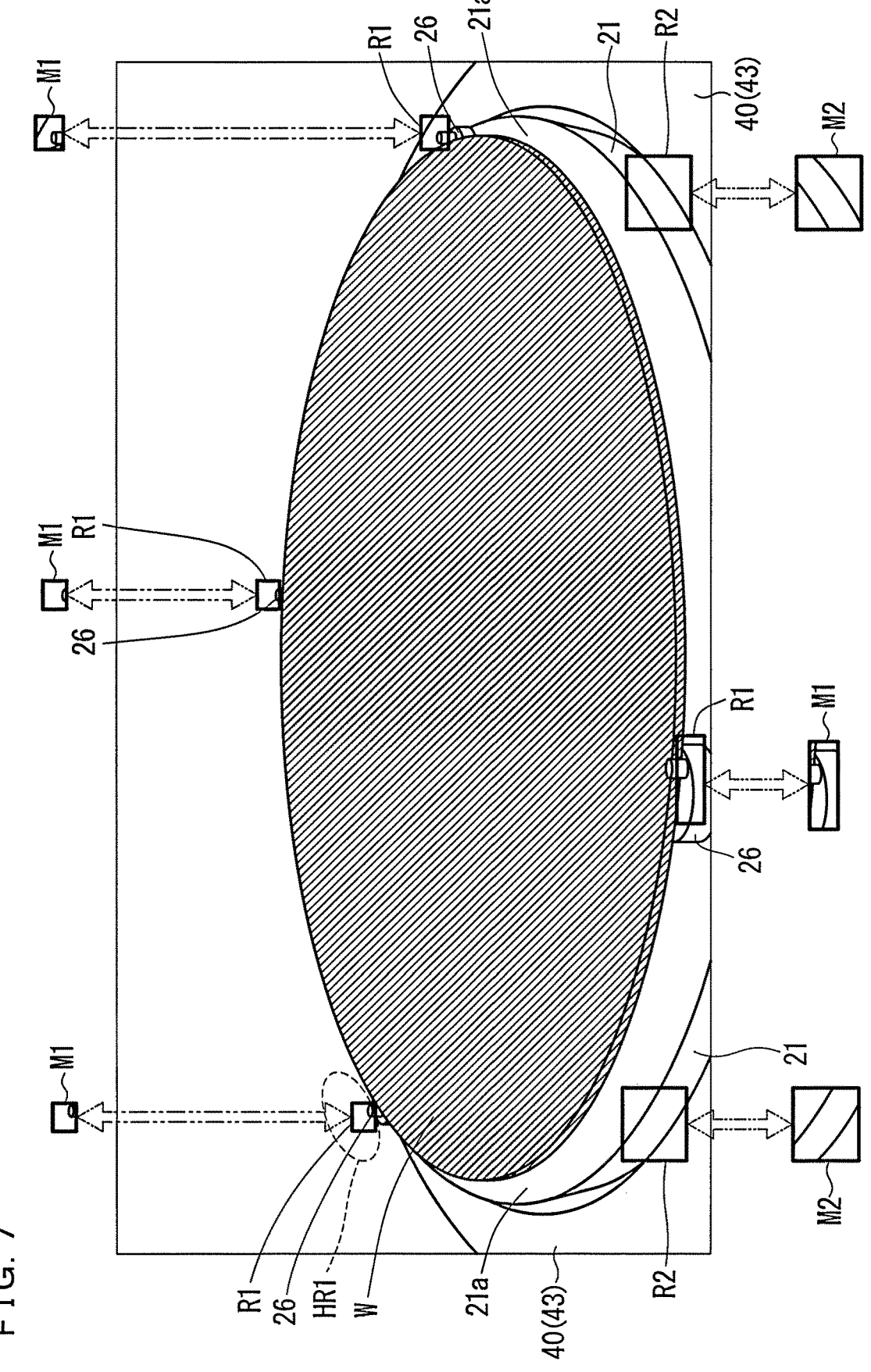
FIG. 7 is a view schematically illustrating an example of a captured image.
Figure 8:
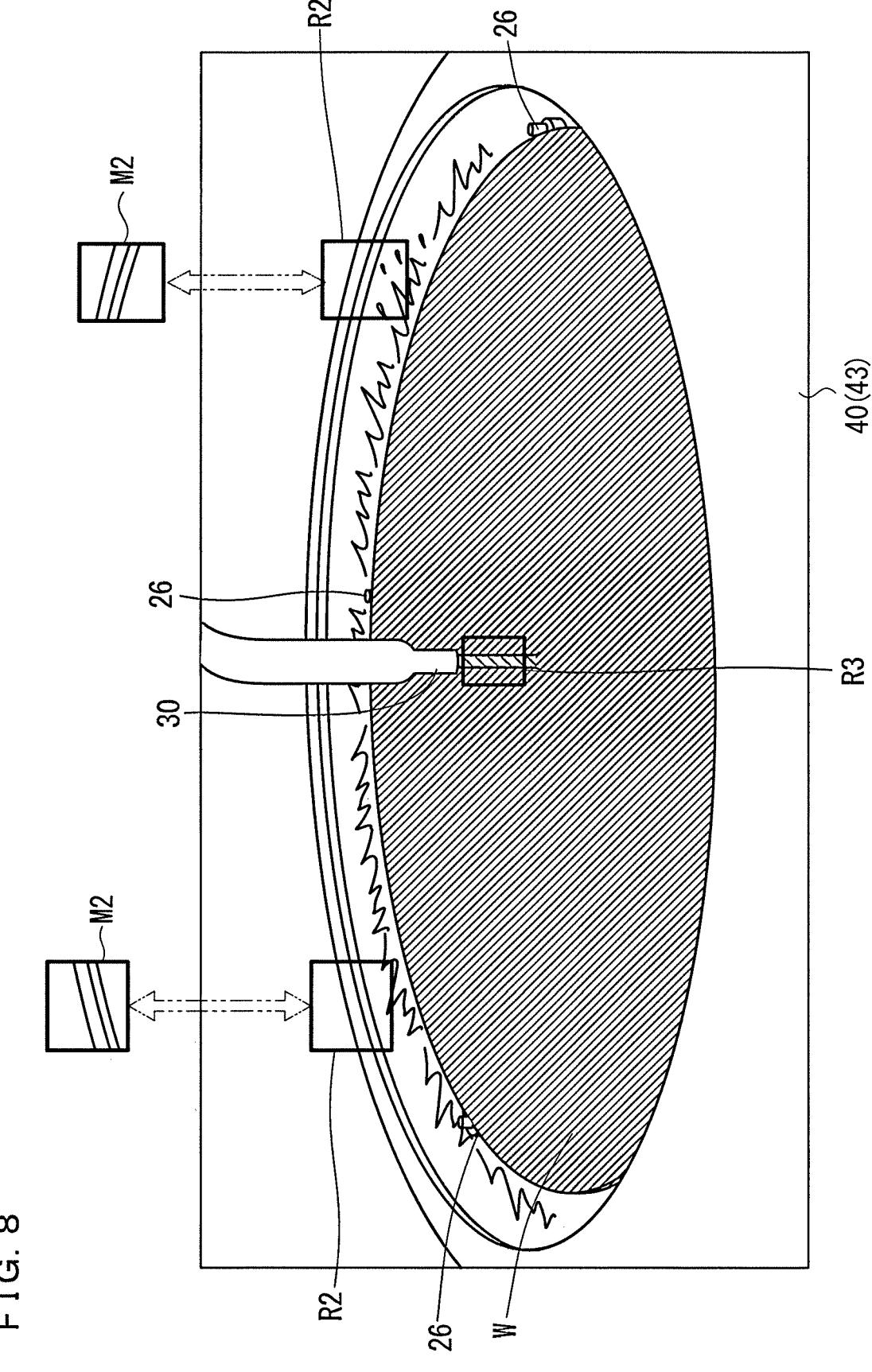
FIG. 8 is a view schematically illustrating an example of the captured image.

FIGS. 7 and 8 are views schematically illustrating examples of the captured image. In the captured image of FIG. 7, the substrate holder 20 holds the substrate W, and the guard part 40 is stopped at the guard standby position. For example, this captured image is obtained by the camera 70 capturing the image of the imaging region in the carry-in and holding step (step S1) or the guard descending process (step S5). In the captured image of FIG. 8, the substrate holder 20 holds the substrate W, only the outer guard 43 is stopped at the guard processing position, and the first nozzle 30 is stopped at the nozzle processing position. For example, this captured image is obtained by the camera 70 capturing the image of the imaging region in the liquid processing step.

The captured image of FIG. 7 includes the entire upper surface of the substrate W held by the substrate holder 20, and the captured image of FIG. 8 includes the entire upper-end peripheral edge of the outer guard 43 located at the guard processing position. That is, the camera 70 is installed such that the entire upper surface of the substrate W and the entire upper-end peripheral edge of the outer guard 43 located at the guard processing position are included in the imaging region. At this point, because the camera 70 captures the image of the imaging region obliquely downward, the upper surface of the substrate W having the circular shape in planar view and the upper-end peripheral edge of the outer guard 43 have an elliptical shape in the captured image.

According to such the imaging region, the plurality of chuck pins 26 are included in the captured image as illustrated in FIG. 7, and the first nozzle 30 located at the nozzle processing position is also included in the captured image as illustrated in FIG. 8. Although not illustrated, the second nozzle 60 and the third nozzle 65 located at the nozzle processing position are also included in the captured image. For this reason, the monitoring processing part 92 can monitor the states of the substrate holder 20, the first nozzle 30, the second nozzle 60, the third nozzle 65, and the guard part 40 based on the captured image.

However, the monitoring processing part 92 does not need to constantly monitor all of these monitoring targets. For example, the monitoring processing part 92 may monitor the discharge state of the first nozzle 30 in the liquid processing step (step S3), but does not need to monitor in other steps.

In monitoring the states of these monitoring targets, the monitoring processing part 92 does not need to use the entire region of the captured image. That is, the monitoring processing part 92 monitors the state of the monitoring target based on a determination region including the monitoring target. For example, a pin determination region R1 and a guard determination region R2 are illustrated in the captured image of FIG. 7. The pin determination region R1 is a region used for monitoring the position of the chuck pin 26 of the substrate holder 20. In the example of FIG. 7, because four chuck pins 26 are included in the captured image, four pin determination regions R1 are previously set corresponding to the four chuck pins 26, respectively. Each pin determination region R1 is set to a region including at least a part of the chuck pin 26 located at the holding position. In the example of FIG. 7, each pin determination region R1 is set so as to include a portion of the chuck pin 26 that abuts on the peripheral edge of the substrate W.

The monitoring processing part 92 monitors the position of the chuck pin 26 based on the pin determination region R1. For example, a reference image M1 for monitoring the position of the chuck pin 26 is previously stored in a storage 94. The reference image M1 is an image in which the chuck pin 26 is normally positioned at the holding position. For example, the reference image M1 is previously generated based on the captured image generated by capturing the image of the imaging region by the camera 70 while the chuck pin 26 is normally located at the holding position. The reference image M1 is an image of the same region as the pin determination region R1. At this point, because a plurality of pin determination regions R1 are provided, a plurality of reference images M1 corresponding to the plurality of pin determination regions R1 are set.

The monitoring processing part 92 monitors the position of the chuck pin 26 by comparing each pin determination region R1 with the corresponding reference image M1. As a specific example, the monitoring processing part 92 calculates a similarity ratio between the pin determination region R1 and the reference image M1. The similarity ratio is not particularly limited, but for example, may be a known similarity ratio such as a sum of squared differences of pixel values, a sum of absolute differences of pixel values, normalization cross-correlation, or zero-mean normalization cross-correlation.

When the chuck pin 26 is located at the holding position, the similarity ratio between the pin determination region R1 and the reference image M1 is high. Conversely, when the similarity ratio is high, it can be considered that the chuck pin 26 is located at the holding position.

Therefore, the monitoring processing part 92 determines that the chuck pin 26 is normally located at the holding position when the similarity ratio is equal to or greater than a predetermined pin threshold, and determines that an abnormality is generated with respect to the chuck pin 26 when the similarity ratio is less than the pin threshold. For example, the pin threshold is previously set by simulation or experiment and stored in the storage 94.

The guard determination region R2 is a region used for monitoring the position of guard part 40. In the example of FIG. 7, two guard determination regions R2 are set. Each guard determination region R2 is set to a region including at least a part of the outer guard 43 located at the guard standby position. In the example of FIG. 7, the guard determination region R2 is set so as to include a part of the upper-end peripheral edge of the outer guard 43.

The monitoring processing part 92 monitors the position of the guard part 40 based on the guard determination region R2. For example, the reference image M2 for monitoring the position of the guard part 40 is previously stored in the storage 94. In the captured image of FIG. 7, because the outer guard 43 is located at the guard standby position, the reference image M2 is an image in which the outer guard 43 is normally located at the guard standby position. For example, the reference image M2 is previously generated based on the captured image generated by capturing the image of the imaging region by the camera 70 while the outer guard 43 is normally located at the guard standby position. The reference image M2 is an image of the same region as the guard determination region R2. In the example of FIG. 7, because a plurality of guard determination regions R2 are provided, a plurality of reference images M2 corresponding to the plurality of guard determination regions R2 are set.

The monitoring processing part 92 monitors the position of the guard part 40 by comparing each guard determination region R2 with the corresponding reference image M2. As a specific example, the monitoring processing part 92 calculates the similarity ratio between the guard determination region R2 and the reference image M2 for each guard determination region R2, determines that the guard part 40 is normally located at the guard standby position when both the similarity ratios are equal to or greater than a predetermined guard threshold, and determines that the abnormality is generated in the guard part 40 when at least one of both the similarity ratios is less than the guard threshold. For example, the guard threshold is previously set by the simulation or experiment and stored in the storage 94.

In the captured image of FIG. 8, only the outer guard 43 is located at the guard processing position. In this case, the guard determination region R2 is set so as to include at least a part of the outer guard 43 located at the guard processing position. In the example of FIG. 8, two guard determination regions R2 are set so as to include a part of the upper-end peripheral edge of the outer guard 43. The image in which only the outer guard 43 is located at the guard processing position is adopted as the reference image M2 corresponding to the guard determination region R2.

The monitoring processing part 92 monitors the position of the outer guard 43 by comparing the guard determination region R2 with the reference image M2 in the same manner as described above.

A discharge determination region R3 is also illustrated in the captured image of FIG. 8. The discharge determination region R3 is a region used for monitoring the discharge state of the processing liquid from the first nozzle 30. The discharge determination region R3 is set as a region containing the liquid columnar processing liquid from the first nozzle 30. In the example of FIG. 8, the discharge determination region R3 is set such that the upper end of the discharge determination region R3 is positioned below the lower end of the first nozzle 30 positioned at the nozzle processing position, and the lower end of the discharge determination region R3 is positioned above a liquid landing position of the processing liquid on the upper surface of the substrate W. The width in the lateral direction of the discharge determination region R3 is set to be wider than the width of the liquid columnar processing liquid.

The monitoring processing part 92 monitors the discharge state of the first nozzle 30 based on the discharge determination region R3. The pixel value in the discharge determination region R3 changes according to the discharge state of the first nozzle 30, so that the monitoring processing part 92 can monitor the discharge state of the first nozzle 30 based on the pixel value in the discharge determination region R3. As a specific example, the monitoring processing part 92 calculates the sum of the pixel values in the discharge determination region R3, determines that the processing liquid is discharged from the first nozzle 30 when the sum is within a predetermined range, and determines that the processing liquid is not discharged from the first nozzle 30 when the sum is out of the predetermined range. For example, the predetermined range is previously set by the simulation or experiment and stored in the storage 94.

<Unnecessary Reflected Light>

Meanwhile, sometimes intensity of reflected light (including scattered light) from each object in the imaging region becomes notably high. In such a case, a high luminance region in which the pixel value is very high is generated in the captured image. Sometimes the high luminance region is entirely or locally generated in the captured image. For example, in the case where the intensity of the illumination light is high, the reflected light from the entire imaging region may be high. In this case, the high luminance region is entirely generated in the captured image. Furthermore, depending on an angle of the reflection surface of each object in the imaging region, regular reflected light from some objects may enter the light receiving surface of the camera 70. Because the intensity of the regular reflected light is high, in this case, the high luminance region may be locally generated in the captured image.

In the example of FIG. 7, a local high luminance region HR1 is schematically indicated by an ellipse. As a remarkable example in which the intensity of the reflected light is high, there is also the case where the pixel value becomes the maximum value in the high luminance region HR1, namely, the pixel value is saturated. When the intensity of the reflected light is increased as described above, the shape of the object in the high luminance region HR1 cannot be appropriately recognized. For this reason, when the reflected light from the object included in each determination region becomes too high, visibility of the object decreases, and eventually, monitoring accuracy may decrease.

For example, when the high luminance region HR1 in which the reflected light is high is included in the pin determination region R1 of the captured image in FIG. 7, the monitoring accuracy of the position of the chuck pin 26 may be degraded. For this reason, when the position of the chuck pin 26 is monitored, it is desirable to reduce the luminance of the high luminance region HR1 in the pin determination region R1. That is, it is desirable to reduce the reflected light from the object in the high luminance region HR1.

The same applies to the case where each of the guard determination region R2 and the discharge determination region R3 includes the high luminance region. That is, when the high luminance region is included in the guard determination region R2, it is desirable to reduce the luminance of the high luminance region in the guard determination region R2 when the position of guard part 40 is monitored. Similarly, when the discharge determination region R3 includes the high luminance region, it is desirable to reduce the luminance of the discharge determination region R3 when the discharge state from the first nozzle 30 is monitored. That is, it is desirable to reduce the reflected light from the object in the high luminance region.

Alternatively, when the processing liquid adheres to each object in the imaging region, a droplet of the processing liquid is included in the captured image. For example, in the captured image of FIG. 8, when the first nozzle 30 discharges the processing liquid, the droplet of the processing liquid is scattered from the peripheral edge of the rotating substrate W. A part of such the processing liquid is included in the guard determination region R2. When the droplet is included in each determination region, the monitoring accuracy may be reduced due to the droplet. For example, when the droplet is included in the guard determination region R2, even when the outer guard 43 is normally stopped at the guard processing position, the similarity ratio between the guard determination region R2 and the reference image M2 decreases, so that the monitoring processing part 92 can erroneously detect the abnormality related to the guard part 40. For this reason, when the position of the guard part 40 is monitored, sometimes it may be desirable to reduce the reflected light from the droplet.

As described above, it is desirable to reduce the unnecessary reflected light corresponding to each monitoring target of the captured image. For example, the unnecessary reflected light includes the high-luminance reflected light and the reflected light from the droplet as described above.

<Polarization Controller>

The polarization state of the reflected light from each object in the imaging region depends on the material of each object. For this reason, the reflected light from the imaging region includes various polarization states according to the object. The reflected light including various polarization states enters the light receiving surface of the camera 70 through the polarizing filter 73 (see also FIG. 3).

When the reflected light is transmitted through the polarizing filter 73, the intensity of the reflected light is reduced at a reduction rate corresponding to its own polarization state and the direction of the absorption axis of the polarizing filter 73. For example, the reflected light in which the polarization direction coincides with the absorption axis of the polarizing filter 73 is ideally absorbed by the polarizing filter 73 and disappears. In this case, the reduction rate is 100%. On the other hand, the reflected light in which the polarization direction is orthogonal to the absorption axis ideally passes through the polarizing filter 73 as it is. In this case, the reduction rate is 0%.

The polarization states of the reflected light from the respective objects are different from each other, so that the reflected light is reduced at mutually different reduction rates when the reflected light from the respective objects passes through the polarizing filter 73. In other words, the reflected light from each object passes through the polarizing filter 73 with different transmittances.

When the filter driver 74 rotates the polarizing filter 73 around the rotation axis Q2, a reduction amount of the reflected light from each object changes according to a rotation position of the polarizing filter 73. For this reason, the intensity of the reflected light from each object can be adjusted by adjusting the rotation position of the polarizing filter 73.

For example, when the filter driver 74 rotates the polarizing filter 73 to a rotation position θ1 where the unnecessary reflected light from an object corresponding to the pin determination region R1 is reduced, the polarizing filter 73 can reduce the unnecessary reflected light. For example, the rotation position θ1 may be a position where the polarization component along the absorption axis of the unnecessary reflected light becomes the highest. When the camera 70 captures the imaging region in this state, the luminance of the high luminance region HR1 in the pin determination region R1 can be reduced, so that the chuck pin 26 appears with high visibility (that is, more clearly) in the pin determination region R1. In other words, the rotation position θ1 can also be said to be the rotation position at which the visibility of the chuck pin 26 in the pin determination region R1 can be enhanced. The visibility of the chuck pin 26 in the pin determination region R1 can be enhanced, so that the monitoring processing part 92 can monitor the position of the chuck pin 26 with higher accuracy.

In the case that the high luminance region is included in guard determination region R2, the filter driver 74 may rotate the polarizing filter 73 to the rotation position where the reflected light corresponding to guard determination region R2 is reduced. Consequently, the polarizing filter 73 can reduce the reflected light. When the camera 70 captures the image of the imaging region in this state, the guard part 40 appears with high visibility in the guard determination region R2 of the captured image. Accordingly, the monitoring processing part 92 can monitor the position of guard part 40 with high accuracy.

Alternatively, when the droplet of the processing liquid is included in the guard determination region R2 while the high luminance region is not included in the guard determination region R2, the reflected light from the droplet may be reduced as the unnecessary reflected light. Specifically, the filter driver 74 rotates the polarizing filter 73 to the rotation position where the reflected light from the droplet of the processing liquid is reduced. Consequently, the polarizing filter 73 can reduce the reflected light. When the camera 70 captures the image of the imaging region in this state, the density of the image of the droplet of the processing liquid can be reduced in the guard determination region R2 of the captured image. The processing liquid is transparent, so that the density of the image of the object located behind the droplet in the imaging direction is increased in the guard determination region R2 of the captured image by reducing the reflected light from the droplets of the processing liquid. For this reason, in the comparison between the guard determination region R2 and the reference image M2, the influence of the droplet can be reduced, and the monitoring processing part 92 can monitor the position of the guard part 40 with higher accuracy.

Because the polarization state of the reflected light from the droplet of the processing liquid depends on the material of the processing liquid, the rotation position of the polarizing filter 73 may be changed according to the kind of the processing liquid in each of the chemical liquid processing, first rinse processing, and second rinse processing in the liquid processing step. That is, when the position of the guard part 40 is monitored in the chemical liquid processing, the polarizing filter 73 is rotated to a rotation position θ2 corresponding to the chemical liquid. When the position of the guard part 40 is monitored in the first rinse processing, the polarizing filter 73 is rotated to a rotation position θ3 corresponding to the first rinse liquid. When the position of the guard part 40 is monitored in the second rinse processing, the polarizing filter 73 is rotated to a rotation position θ4 corresponding to the second rinse processing.

Accordingly, the polarizing filter 73 can more appropriately reduce the reflected light from the droplet in each processing, so that the image of the object located behind the droplet in the imaging direction can be made darker while making the image of the droplet lighter in the guard determination region R2. For this reason, the monitoring processing part 92 can monitor the position of the guard part 40 with higher accuracy by reducing the influence of the droplet.

<Specific Flow of Monitoring Processing>

FIG. 9 is a flowchart schematically illustrating an example of monitoring processing. Hereinafter, the case where the position of the chuck pin 26 is monitored in the carry-in and holding step (step S1) will be described as a specific example.

First, the filter driver 74 rotates the polarizing filter 73 to the rotation position where the unnecessary reflected light corresponding to the chuck pin 26 is reduced (step S11: polarization adjustment step). At this point, a plurality of monitoring targets and a plurality of rotation positions corresponding to a plurality of monitoring timings are previously set by the simulation or experiment, and angle data indicating the rotation positions are previously stored in the storage 94. Table 1 is a table schematically illustrating an example of the angle data.

TABLE 1

| Monitoring target | Monitoring timing | Rotation angle of polarizing filter |
|---|---|---|
| Chuck pin | — | θ1 |
| Guard part | Chemical liquid processing | θ2 |
| | First rinse processing | θ3 |
| | Second rinse processing | θ4 |

In Table 1, the rotation position θ1 where the luminance of the high luminance region HR1 in the pin determination region R1 is reduced is previously set as the rotation position in the case where the monitoring target is the chuck pin 26. In Table 1, when the monitoring target is the guard part 40, the rotation position is set according to the kind of the processing in the liquid processing step. Specifically, the rotation position θ2 where the reflected light from the droplet of the chemical liquid is reduced is previously set as the rotation position when the chemical liquid processing is performed. Similarly, the rotation positions θ3, θ4 where the reflected light from droplets of the first rinse liquid and the second rinse liquid is reduced are previously set as the rotation positions corresponding to the first rinse liquid and the second rinse liquid, respectively.

The polarization controller 91 reads the angle data from the storage 94, specifies the rotation position corresponding to the monitoring target and the monitoring timing, and outputs a control signal indicating the rotation position to the filter driver 74. In this case, the polarization controller 91 reads the rotation position θ1 from the angle data, and outputs the control signal instructing the rotation to the rotation position θ1 to the filter driver 74. The filter driver 74 rotates the polarizing filter 73 to the rotation position θ1 based on the control signal.

Subsequently, the camera 70 captures the image of the imaging region to generate the captured image while the illuminator 71 irradiates the imaging region with the illumination light, and the camera 70 outputs the captured image to the controller 9 (step S12: imaging step). For example, this imaging step is performed after the processing controller 93 outputs the control signal, which moves the chuck pin 26 to the holding position, to a chuck driver in the carry-in and holding step. In the immediately preceding polarization adjustment step, because the rotation position of the polarizing filter 73 is located at the rotation position θ1, the unnecessary reflected light from the object corresponding to the high luminance region HR1 is reduced by the polarizing filter 73. Accordingly, in the captured image, the luminance of the high luminance region HR1 is small, and the visibility of the chuck pin 26 in the pin determination region R1 is high.

Subsequently, the monitoring processing part 92 monitors the state of the monitoring target based on the captured image generated in the imaging step after the polarization adjustment step (step S13: monitoring step). For example, as described above, the monitoring processing part 92 monitors the position of the chuck pin 26 based on the comparison between the pin determination region R1 of the captured image and the reference image M1. Specifically, the monitoring processing part 92 determines that the position of the chuck pin 26 is normal when the similarity ratio between the pin determination region R1 and the reference image M1 is equal to or greater than the pin threshold, and the monitoring processing part 92 determines that the abnormality is generated with respect to the chuck pin 26 when the similarity ratio is less than the pin threshold.

When the monitoring processing part 92 determines that the abnormality is generated with respect to the monitoring target (in this case, the chuck pin 26), the controller 9 may interrupt the processing of the substrate W, or notify a notification part such as a display (not illustrated) of the abnormality.

As described above, according to the present embodiment, the polarizing filter 73 is provided, and the filter driver 74 rotates the polarizing filter 73 to the rotation position where the unnecessary reflected light corresponding to the monitoring target can be reduced. For this reason, the unnecessary reflected light incident on the light receiving surface of the camera 70 can be reduced, and the influence of the unnecessary reflected light can be reduced in the captured image. Accordingly, the monitoring processing part 92 can monitor the monitoring target with higher accuracy based on the captured image.

Moreover, in the above-described specific example, the polarization controller 91 reads the angle data from the storage 94 and instructs the filter driver 74 on the rotation position defined by the angle data. The filter driver 74 rotates the polarizing filter 73 to the rotation position based on the angle data. When the previously set rotation position is adopted in this manner, the rotation position can be determined by simpler processing.

In the above example, the rotation position θ1 where the unnecessary reflected light in the pin determination region R1 is reduced and the rotation positions θ2 to θ4 where the unnecessary reflected light in the guard determination region R2 is reduced are set in the angle data. However, the present embodiment is not necessarily limited to the pin determination region R1 and the guard determination region R2. For example, the same applies to the discharge determination region R3. For example, when the reflected light from the substrate W in the discharge determination region R3 can be reduced by the polarizing filter 73, the rotation position where the unnecessary reflected light from the substrate W is effectively reduced may be set. In short, a first rotation position where the unnecessary reflected light in the first determination region of the captured image used for monitoring the first monitoring target as the monitoring target is reduced and a second rotation position where the unnecessary reflected light in the second determination region of the captured image used for monitoring the second monitoring target as the monitoring target is reduced may be set.

When the state of the first monitoring target is monitored, the camera 70 captures the image of the imaging region while the filter driver 74 rotates the polarizing filter 73 to the first rotation position, and the monitoring processing part 92 may monitor the first monitoring target based on the first determination region of the captured image. Similarly, when the state of the second monitoring target is monitored, the camera 70 may capture the image of the imaging region while the filter driver 74 rotates the polarizing filter 73 to the second rotation position, and the monitoring processing part 92 may monitor the second monitoring target based on the second determination region of the captured image.

Accordingly, the polarizing filter 73 can appropriately reduce the unnecessary reflected light in the determination region corresponding to the monitoring target according to the monitoring target. For this reason, the monitoring processing part 92 can monitor the state of the monitoring target based on the determination region in which the unnecessary reflected light is reduced. Accordingly, the monitoring processing part 92 can monitor the state of the monitoring target with higher accuracy.

In the above example, in the angle data, the rotation positions θ2 to θ4 are set according to the kind of the processing liquid in the guard determination region R2. This is because the kind of the processing liquid included in the guard determination region R2 varies depending on the monitoring timing. However, such the object is not limited to the processing liquid. In short, when the object that causes the unnecessary reflected light changes depending on the monitoring timing, the rotation position may be set as follows. That is, a first rotation position where the unnecessary reflected light from the first object in the imaging region is reduced and the second rotation position where the unnecessary reflected light from the second object different from the first object in the imaging region is reduced may be set.

When the first object exists in the imaging region (more specifically, the region corresponding to the determination region), the camera 70 captures the image of the imaging region to generate the captured image while the filter driver 74 rotates the polarizing filter 73 to the first rotation position, and the monitoring processing part 92 monitors the state of the monitoring target based on the captured image. Similarly, when the second object exists in the imaging region, the camera 70 captures the image of the imaging region to generate the captured image while the filter driver 74 rotates the polarizing filter 73 to the second rotation position, and the monitoring processing part 92 monitors the state of the monitoring target based on the captured image.

This enables the polarizing filter 73 to reduce the unnecessary reflected light corresponding to the object existing in the imaging region. For this reason, the monitoring processing part 92 can monitor the state of the monitoring target based on the captured image in which the influence of the unnecessary reflected light is reduced. Accordingly, the monitoring processing part 92 can monitor the state of the monitoring target with higher accuracy.

<Method for Determining Rotation Position>

In the above example, the polarization controller 91 determines the rotation position based on the previously set angle data, but the present embodiment is not necessarily limited thereto. The polarization controller 91 may determine the rotation position of the polarizing filter 73 based on the captured image. Specifically, the camera 70 captures the image of the imaging region each time to generate a plurality of captured images while the filter driver 74 sequentially changes the rotation position of the polarizing filter 73, and the polarization controller 91 determines the rotation position of the polarizing filter 73 based on the plurality of captured images. A more specific example will be described below.

FIG. 10 is a flowchart illustrating a specific example of the polarization adjustment step. First, the polarization controller 91 outputs the control signal to the filter driver 74, and causes the filter driver 74 to rotate the polarizing filter 73 to a rotation position θ[1] (step S21). At this point, for example, a rotation position θ[n] (n=1, 2, . . . , N) is a rotation position obtained by dividing 360 degrees into N.

Subsequently, the camera 70 captures the image of the imaging region to generate the captured image, and outputs the captured image to the controller 9 (step S22). Consequently, the captured image corresponding to the rotation position θ[1] is obtained.

Subsequently, the polarization controller 91 calculates an index related to the intensity of the unnecessary reflected light based on the captured image (step S23). For example, the index is contrast. Referring to the example of FIG. 7, when the high luminance region HR1 is included in the entire pin determination region R1, the contrast of the pin determination region R1 is low. When the luminance of the high luminance region HR1 decreases, the object in the pin determination region R1 becomes clear, so that the contrast increases. Conversely, it can be considered that the luminance of the high luminance region HR1 is low and the object in the pin determination region R1 is clear in the case where the contrast is high, and it can be considered that the luminance of the high luminance region HR1 is high and the visibility of the object is low in the case where the contrast is low. That is, it can be said that the contrast indicates the intensity of the unnecessary reflected light. Accordingly, the polarization controller 91 calculates the contrast of the pin determination region R1 as the index.

Alternatively, in the case where the high luminance region HR1 is included in the entire pin determination region R1, the higher the luminance of the high luminance region HR1, the lower the visibility of the object, so that the number of contour lines in the pin determination region R1 is reduced. When the luminance of the high luminance region HR1 decreases, the object in the pin determination region R1 becomes clear, so that the number of contour lines increases. Conversely, it can be considered that the luminance of the high luminance region HR1 is low and the object in the pin determination region R1 is clear in the case where the number of contour lines is large, and it can be considered that the luminance of the high luminance region HR1 is high and the visibility of the object is low in the case where the number of contour lines is small. That is, it can be said that the number of contour lines indicates the intensity of the unnecessary reflected light. Accordingly, the polarization controller 91 may calculate the number of contour lines in the pin determination region R1 as the index. Specifically, the polarization controller 91 performs edge detection processing such as the Canny method on the pin determination region R1 to generate an edge image, performs contour line tracking on the edge image to perform labeling processing on the contour line, and calculates the number of labeled contour lines as the number of contour lines.

Subsequently, the polarization controller 91 determines whether the calculated index is equal to or greater than a predetermined threshold (step S24). For example, the threshold is previously set by the simulation or experiment, and previously stored in the storage 94.

When the index is less than the threshold, the influence of the unnecessary reflected light is still large in the pin determination region R1 of the captured image, so that the polarization controller 91 causes the filter driver 74 to rotate the polarizing filter 73 to a rotation position $\theta[2]$ in step S21. For example, the rotation position $\theta[2]$ is a position rotated by a predetermined angle with respect to the rotation position $\theta[1]$. The polarization controller 91 again executes steps S22 to S24 in this order.

By repeating steps S21 to S23, the captured image corresponding to each rotation position $\theta[n]$ can be obtained while sequentially rotating the rotation position of the polarizing filter 73 by a predetermined angle, and further obtain the index of each captured image. That is, the index can be obtained for each rotation position $\theta[n]$.

Then, when the index of the captured image is less than the predetermined threshold, the influence of the unnecessary reflected light can be sufficiently reduced in the pin determination region R1 of the captured image, so that the polarization controller 91 determines the rotation position of the polarizing filter 73 as the rotation position determined in the latest step S21 (step S25).

As described above, according to the above-described operation, the polarization controller 91 sequentially rotates the polarizing filter 73, and determines the rotation position of the polarizing filter 73 based on the index of the captured image corresponding to each rotation position $\theta[n]$. For this reason, the worker does not need to previously determine the rotation position of the polarizing filter 73, and the burden on the worker can be reduced.

In the example of FIG. 10, the rotation position of the polarizing filter 73 is determined when the index becomes equal to or greater than the threshold, but the present embodiment is not necessarily limited thereto. Indexes corresponding to all the rotation positions $\theta[1], \ldots, \theta[N]$ may be obtained once, and the rotation position may be determined by comparing these indexes. For example, the polarization controller 91 may determine the rotation position such that the index becomes the highest.

<Illuminator>

Figure 11:
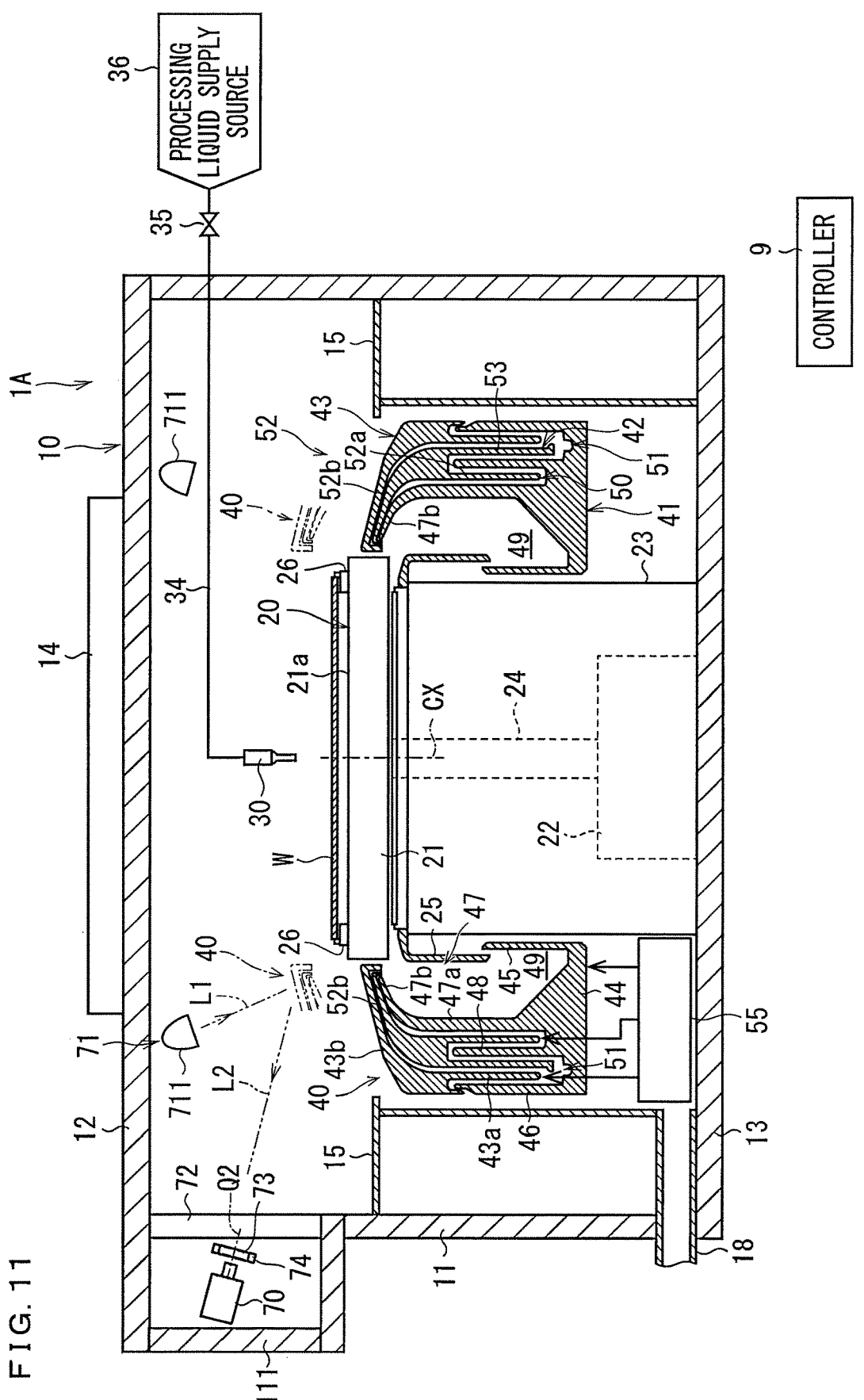
FIG. 11 is a view schematically illustrating a configuration of a processing unit according to another embodiment.

FIG. 11 is a view schematically illustrating a configuration of another embodiment of the processing unit 1. Hereinafter, the processing unit 1 in FIG. 11 is referred to as a processing unit 1A. The processing unit 1A is different from the processing unit 1 in the configuration of the illuminator 71.

In the processing unit 1A, the illuminator 71 is provided at a position closer to the rotation axis CX than the illuminator 71 of the processing unit 1. In the example of FIG. 3, the radial position of the illuminator 71 of the processing unit 1 is outside the outermost periphery of the guard part 40, whereas in the example of FIG. 11, the radial position of the illuminator 71 of the processing unit 1A is inside the outermost periphery of the guard part 40. In the processing unit 1A, the camera 70 is provided on the radially outer side of the illuminator 71 with respect to the imaging region.

In the example of FIG. 11, the illuminator 71 of the processing unit 1A includes a plurality of unit illuminators 711. Each unit illuminator 711 has a light source such as a light emitting diode. As illustrated in FIG. 11, the plurality of unit illuminators 711 may be located radially outside the fan filter unit 14. Consequently, the illuminator 71 hardly disturbs a flow of an airflow from the fan filter unit 14. The plurality of unit illuminators 711 may be provided side by side along the circumferential direction around the rotation axis CX. The plurality of unit illuminators 711 may be provided at equal intervals in the circumferential direction.

An angle formed by a virtual line L1 connecting each unit illuminator 711 and the monitoring target and a virtual line L2 connecting the camera 70 and the monitoring target can be increased in the processing unit 1A.

It is known that the polarization state of the reflected light incident on the polarizing filter 73 from the object also depends on the position of the light source. For example, when the angle formed by the virtual line (the virtual line L1 in FIG. 11) connecting the light source and the object and the virtual line (the virtual line L2 in FIG. 11) connecting the object and the camera 70 becomes close to 90 degrees, the polarization state of the reflected light (including the scattered light) becomes close to linearly polarized light, so that the effect of reducing the reflected light by the polarizing filter 73 can be enhanced.

According to the processing unit 1A, the angle formed by the virtual line L1 and the virtual line L2 can be brought close to 90 degrees, so that the effect of reducing the unnecessary reflected light by the polarizing filter 73 can be enhanced.

An example of the monitoring processing in the processing unit 1A is similar to the flowchart of FIG. 9. In this case, the illuminator 71 may emit illumination light from all of the plurality of unit illuminators 711.

<Unit Illuminator>

On the other hand, when monitoring the monitoring target, the controller 9 may cause the unit illuminator 711 corresponding to the monitoring target among the plurality of unit illuminators 711 to emit the illumination light. More specifically, the controller 9 may cause the unit illuminator 711 in which the effect of reducing the reflected light becomes high among the plurality of unit illuminators 711 to emit the illumination light.

FIG. 12 is a functional block diagram schematically illustrating an example of an internal configuration of the controller 9 of the processing unit 1A according to another embodiment. The controller 9 further includes an illumination controller 95. The illumination controller 95 can control the plurality of unit illuminators 711 independently of each other. As will be described later, the illumination controller 95 switches on and off of the unit illuminator 711 according to the monitoring target. That is, among the plurality of unit illuminators 711, the unit illuminator 711 that emits irradiation light is made different according to the monitoring target.

FIG. 13 is a flowchart illustrating an example of monitoring processing according to another embodiment. First, the illumination controller 95 causes the unit illuminator 711 corresponding to the monitoring target to emit the illumination light (step S31: illumination step). At this point, the unit illuminator 711 corresponding to the monitoring target is previously set by the simulation or experiment, and illumination data indicating the unit illuminator 711 is previously stored in the storage 94. Table 2 schematically illustrates an example of the illumination data.

TABLE 2

| Monitoring target | Unit illuminator |
| --- | --- |
| Chuck pin 26a | Unit illuminator 711a |
| Chuck pin 26b | Unit illuminator 711b |
| Chuck pin 26c | Unit illuminator 711c |
| Chuck pin 26d | Unit illuminator 711d |
| Guard part 40 | Unit illuminator 711e |

In Table 2, when the monitoring target is the chuck pin 26, the unit illuminator 711 is set for each chuck pin 26. Specifically, unit illuminators 711a to 711d are previously set corresponding to the chuck pins 26a to 26d of the chuck pins 26, respectively. In Table 2, when the monitoring target is the guard part 40, a unit illuminator 711e of the unit illuminator 711 is set. When the positions of the guard determination region R2 are different in the guard standby position and the guard processing position, the unit illuminator 711 corresponding to each position may be set.

The unit illuminator 711 may be previously set as follows. That is, for example, the unit illuminator 711 corresponding to the monitoring target may be set such that the angle formed by the virtual line connecting the unit illuminator 711 and the monitoring target and the virtual line connecting the monitoring target and the camera 70 becomes close to 90 degrees.

Alternatively, the worker may previously set the unit illuminator 711 by visually recognizing the captured image. More specifically, while the unit illuminator 711 that emits the illumination light is sequentially changed, in each illumination mode, the worker may visually recognize the plurality of captured images when the polarizing filter 73 is rotated around the rotation axis Q2, and set the unit illuminator 711 and the rotation position of the polarizing filter 73 that are appropriate for monitoring the monitoring target. That is, the worker may visually recognize the actual captured image and set the unit illuminator 711 and the rotation position of the polarizing filter 73 that can appropriately reduce the unnecessary reflected light through a user interface (not illustrated).

In the example of Table 2, one unit illuminator 711 is set corresponding to the monitoring target. However, the plurality of unit illuminators 711 may be set.

The illumination controller 95 reads the angle data from the storage 94 and outputs the control signal to the unit illuminator 711 corresponding to the monitoring target. The unit illuminator 711 emits the illumination light based on the control signal. The imaging region is irradiated with the illumination light.

Subsequently, the polarization controller 91 outputs the control signal to the filter driver 74 to cause the filter driver 74 to rotate the polarizing filter 73 (step S32: polarization adjustment step). For example, the polarization controller 91 reads the angle data from the storage 94, and outputs the control signal instructing the filter driver 74 to rotate to the rotation position included in the angle data. The filter driver 74 rotates the polarizing filter 73 to the rotation position based on the control signal.

Subsequently, the camera 70 captures the image of the imaging region to generate the captured image, and outputs the captured image to the controller 9 (step S33: imaging step). In this imaging step, the illumination light is emitted from the unit illuminator 711 that can effectively reduce the unnecessary reflected light, and the rotation position of the polarizing filter 73 is the position where the unnecessary reflected light can be reduced, so that the captured image having a small influence of the unnecessary reflected light can be obtained.

Subsequently, the monitoring processing part 92 monitors the state of the monitoring target based on the captured image (step S34: monitoring step). The monitoring step is similar to the monitoring step of step S13.

According to the above-described operation, the unit illuminator 711 disposed at the position where the effect of reducing the unnecessary reflected light is high among the plurality of unit illuminators 711 irradiates the illumination light. For this reason, the influence of the unnecessary reflected light in the captured image can be further reduced, and the monitoring processing part 92 can monitor the state of the monitoring target with higher accuracy.

Second Embodiment

FIG. 14 is a view schematically illustrating an example of a configuration of a substrate processing apparatus 100A according to a second embodiment. The substrate processing apparatus 100A is a batch type processing apparatus that collectively processes the plurality of substrates W. The substrate processing apparatus 100A includes a processing unit 1B. Although not illustrated, the substrate processing apparatus 100A includes various configurations such as a load port carrying in and out a carrier containing the plurality of substrates W and a substrate conveyance part (not illustrated) conveying the plurality of substrates W between the load port and the processing unit 1B. The substrate processing apparatus 100A may include a plurality of processing units 1B.

The processing unit 1B includes a processing tank 15B, a lifter 20B, a liquid supply part 30B, a liquid discharge part 40B, a camera 70B, an illuminator 71B, a polarizing filter 73B, and a filter driver 74B.

In the example of FIG. 14, a chamber 10B is also provided. In the example of FIG. 14, the chamber 10B has a box shape that opens vertically upward. An openable and closable lid may be provided at the upper end of the chamber 10B.

The processing tank 15B is provided in the chamber 10B and has a box shape opening vertically upward. The processing tank 15B stores the processing liquid.

The liquid supply part 30B supplies the processing liquid to the processing tank 15B. In the example of FIG. 14, the liquid supply part 30B includes a nozzle 31B, a liquid supply pipe 32B, and a valve 33B. The nozzle 31B is provided on the lower side in the processing tank 15B. A downstream end of the liquid supply pipe 32B is connected to the nozzle 31B, and an upstream end of the liquid supply pipe 32B is connected to a processing liquid supply source 34B. The processing liquid supply source 34B has a tank (not illustrated) that stores the processing liquid.

The valve 33B is provided in the liquid supply pipe 32B. When the valve 33B is open, the processing liquid is supplied from the processing liquid supply source 34B to the nozzle 31B through the liquid supply pipe 32B, and discharged from the discharge port of the nozzle 31B to the processing tank 15B. When the valve 33B is closed, the supply of the processing liquid to the processing tank 15B is terminated.

The lifter 20B (corresponding to a substrate holder) holds the substrate W and ascends and descends the held substrate W. The lifter 20B can hold the plurality of substrates W. For example, the lifter 20B holds the plurality of substrates W while the plurality of substrates W are arranged at intervals in the thickness direction of the substrates W. In the example of FIG. 14, the lifter 20B includes a connecting plate 21B and a plurality of support members 22B. The connecting plate 21B is provided in a posture in which the thickness direction of the connecting plate 21B is along the horizontal direction. The plurality of support members 22B have an elongated shape extending along the thickness direction of the connecting plate 21B, and one ends of the plurality of support members 22B are connected to the connecting plate 21B. A plurality of grooves (not illustrated) into which the plurality of substrates W are inserted is formed in each support member 22B. When the substrate W is inserted into the groove of the support member 22B, the support member 22B supports the substrate W in a standing posture.

The lifter 20B includes an ascending and descending mechanism (not illustrated), and ascends and descends the plurality of substrates W between a processing position inside the processing tank 15B and a pull-up position vertically above the processing tank 15B. For example, the ascending and descending mechanism includes a ball screw mechanism and a motor, and ascends and descends the connecting plate 21B. Consequently, the plurality of substrates W supported by the support member 22B also ascend and descend. When the lifter 20B descends the plurality of substrates W to the processing position, the plurality of substrates W can be immersed in the processing liquid.

The lifter 20B delivers the substrate conveyance part (not illustrated) and a plurality of substrates W at the pull-up position. As a specific example, the substrate conveyance part conveys the plurality of unprocessed substrates W from the load port to the pull-up position, and transfers the plurality of substrates W to the lifter 20B at the pull-up position. When the lifter 20B descends the plurality of substrates W to the processing position, the plurality of substrates W are immersed in the processing liquid, and processing corresponding to the processing liquid is performed on the plurality of substrates W. When the lifter 20B ascends the plurality of processed substrates W to the pull-up position, the substrate conveyance part receives the plurality of substrates W from the lifter 20B and conveys the substrates W to the next processing unit 1B or the load port.

The liquid discharge part 40B discharges the processing liquid from the processing tank 15B to the outside. The liquid discharge part 40B includes a liquid discharge pipe 41B and a valve 42B. For example, the upstream end of the liquid discharge pipe 41B is connected to the bottom part of the processing tank 15B, and the downstream end of the liquid discharge pipe 41B is connected to the outside. The valve 42B is provided in the liquid discharge pipe 41B. When the valve 42B is open, the processing liquid is supplied from the processing tank 15B to the outside through the liquid discharge pipe 41B. When the valve 42B is closed, the discharge of the processing liquid ends.

The camera 70B is provided vertically above the processing tank 15B, and captures the image of the imaging region including the inside (specifically, the bottom part) of the processing tank 15B. The configuration of the camera 70B is similar to that of the camera 70. In the example of FIG. 14, the camera 70B is provided above the chamber 10B. In the example of FIG. 14, the camera 70B is provided directly above the processing tank 15B, and the camera 70B is provided such that the imaging direction of the camera 70B is along the vertically downward direction. The imaging direction of the camera 70B is not limited to the vertically downward direction, and may be inclined with respect to the vertical direction. That is, the imaging direction of the camera 70B may be along the obliquely downward direction.

The illuminator 71B is provided vertically above the processing tank 15B, and irradiates the imaging region of the camera 70B with the illumination light. In the example of FIG. 14, the illumination direction of the illuminator 71B is along the obliquely downward direction. The configuration of the illuminator 71B is similar to that of the illuminator 71.

The polarizing filter 73B is provided between the camera 70B and the imaging region. The polarizing filter 73B is similar to the polarizing filter 73.

The filter driver 74B rotates the polarizing filter 73B around a rotation axis Q3 along the optical axis of the polarizing filter 73B. Consequently, the absorption axis of the polarizing filter 73B rotates around the rotation axis Q3. In the example of FIG. 14, the rotation axis Q3 is also a direction along the imaging direction of the camera 70B. The configuration of the filter driver 74B is similar to that of the filter driver 74.

The controller 9 is similar to that of the first embodiment. That is, the controller 9 includes the polarization controller 91, the monitoring processing part 92, and the processing controller 93. The polarization controller 91 controls the filter driver 74B. The monitoring processing part 92 monitors the state of the monitoring target based on the captured image from the camera 70B. The processing controller 93 controls the processing unit 1B and the substrate conveyance part to cause the substrate processing apparatus 100A to perform the processing on the substrate W.

Also in such the processing unit 1B, the controller 9 can monitor various configurations in the chamber 10B as monitoring targets based on the captured image from the camera 70B. As a specific example, the monitoring target includes the bottom part of the processing tank 15B. A fragment of the substrate W may remain at the bottom part of the processing tank 15B. That is, when any one of the plurality of substrates W held by the lifter 20B is chipped (namely, cracking), the fragment falls to the bottom part of the processing tank 15B.

In this case, after the lifter 20B pulls up the substrate W from the processing tank 15B to pass the substrate W to the substrate conveyance part (not illustrated), the camera 70B captures the image of the imaging region. The controller 9 determines the presence or absence of the fragment of the substrate W at the bottom part of the processing tank 15B based on the captured image.

FIG. 15 is a view schematically illustrating an example of the captured image. The captured image of FIG. 15 includes the inside of the processing tank 15B, and includes a fragment Wa1 of the substrate W.

Incidentally, in the storage state in which the processing liquid is stored in the processing tank 15B, the visibility of the bottom part of the processing tank 15B is actually low in the captured image. This is because the illumination light is reflected by the liquid level of the processing liquid stored in the processing tank 15B. In the example of FIG. 15, a high luminance region HR2 reflected by the liquid level of the processing liquid is schematically indicated by a broken line. In the example of FIG. 15, because the fragment Wa1 is included in the high luminance region HR2, the visibility of the fragment Wa1 is actually low, and the fragment Wa1 is unclear.

On the other hand, even in an empty state where the processing liquid is not stored in the processing tank 15B, the high luminance region may be formed in the captured image by the reflection from the inside of the processing tank 15B. In such the high brightness region, the visibility of the fragment Wa1 is low, and the fragment Wa1 becomes unclear.

For this reason, the polarization controller 91 outputs the control signal to the filter driver 74B to reduce the unnecessary reflected light by the polarizing filter 73B. The polarization state of the reflected light from the liquid level in the storage state is different from the polarization state of the reflected light from the inside of the processing tank 15B in the empty state, so that the polarization controller 91 controls the filter driver 74B at the rotation position corresponding to each state. For example, the rotation position corresponding to the state of the processing tank 15B is previously set, and the angle data indicating the rotation position is previously stored in the storage 94.

An example of the monitoring processing for the bottom part of the processing tank 15B is similar to the flowchart of FIG. 9. That is, in the polarization adjustment step (step S11), the filter driver 74B rotates the polarizing filter 73B based on the unnecessary reflected light, and reduces the unnecessary reflected light by the polarizing filter 73B. As a specific example, the rotation position according to the state of the processing tank 15B is previously set by the simulation or experiment, and the angle data indicating the rotation position is previously stored in the storage 94. Table 3 schematically illustrates an example of the angle data.

TABLE 3

| Monitoring timing | Rotation angle of polarizing filter |
| --- | --- |
| Storage state | θ10 |
| Empty state | θ11 |

In Table 3, a rotation position θ10 where the unnecessary reflected light from the liquid level of the processing liquid is reduced is previously set as the rotation position when the processing liquid is stored in the processing tank 15B. In Table 3, a rotation position θ11 where the unnecessary reflected light from the inside of the processing tank 15B is reduced is previously set as the rotation position when the processing tank 15B is empty.

The polarization controller 91 reads the angle data from the storage 94. When the processing liquid is stored in the processing tank 15B, the polarization controller 91 specifies the rotation position θ10 according to the storage state from the angle data, and outputs the control signal instructing the rotation to the rotation position θ10 to the filter driver 74B. On the other hand, when the processing liquid is not stored in the processing tank 15B, the polarization controller 91 specifies the rotation position θ11 according to the empty state from the angle data, and outputs the control signal instructing the rotation to the rotation position θ11 to the filter driver 74B. The filter driver 74B rotates the polarizing filter 73B based on the control signal.

The polarization controller 91 does not necessarily need to determine the rotation position based on the angle data of the storage 94, and may determine the rotation position of the polarizing filter 738 based on the plurality of captured images when the polarizing filter 73B is sequentially rotated similarly to the first embodiment.

Subsequently, in the imaging step (step S12), the camera 70B captures the image of the imaging region to generate the captured image, and outputs the captured image to the controller 9.

Subsequently, in the monitoring step (step S13), the monitoring processing part 92 determines the presence or absence of the fragment Wa1 of the substrate W inside the processing tank 15B based on the captured image. As a specific example, a reference image M4 for monitoring the processing tank 15B is previously stored in the storage 94. The reference image M4 is an image including the processing tank 15B in the state where the fragments Wa1 do not remain, and for example, for example, the image when the processing tank 15B is empty. For example, the reference image M4 is previously generated based on the captured image generated by the camera 70B capturing the image of the imaging region in the state where no fragment Wa1 remains. The reference image M4 is an image of the same region as the captured image.

The monitoring processing part 92 monitors the internal state of the processing tank 15B by comparing the captured image with the reference image M4. For example, first, the monitoring processing part 92 calculates the similarity ratio between the captured image and the reference image M4. When the similarity ratio between the captured image and the reference image M4 is high, it is considered that the fragment Wa1 of the substrate W does not remain.

Accordingly, the monitoring processing part 92 determines the presence or absence of the fragment Wa1 of the substrate W by comparing the similarity ratio with a fragment threshold. For example, the fragment threshold value is previously set by the simulation or experiment, and is stored in the storage 94. The monitoring processing part 92 determines that the fragment Wa1 does not remain when the similarity ratio is equal to or greater than the fragment threshold, and the monitoring processing part 92 determines that the fragment Wa1 remains when the similarity ratio is less than the fragment threshold.

As described above, in the polarization adjustment step, the polarizing filter 73B stops at the rotation position corresponding to the state of the processing tank 15B. In other words, the polarizing filter 73B stops at the rotation position corresponding to the unnecessary reflected light from each object in the imaging region. Specifically, when the processing liquid is stored in the processing tank 15B, the polarizing filter 73B stops at the rotation position θ10 corresponding to the unnecessary reflected light from the liquid level of the processing liquid, and when the processing liquid is not stored, the polarizing filter stops at the rotation position θ10 corresponding to the unnecessary reflected light from the inside of the processing tank 15B. For this reason, the polarizing filter 73B can appropriately reduce the unnecessary reflected light according to each state.

Accordingly, the influence of the unnecessary reflected light in the captured image can be reduced, and the inside of the processing tank 15B can be clarified. Accordingly, the monitoring processing part 92 can monitor the inside of the processing tank 15B with higher accuracy. More specifically, because the influence of the unnecessary reflected light can be reduced in the similarity ratio between the captured image and the reference image M4, the influence of the unnecessary reflected light is small even in the comparison between the similarity ratio and the fragment threshold. Accordingly, the monitoring processing part 92 can determine the presence or absence of the fragment Wa1 with high accuracy.

Similarly to the first embodiment, the illuminator 71B may include a plurality of unit illuminators 711, and the controller 9 may include the illumination controller 95.

In the above example, the monitoring processing part 92 determines the presence or absence of the fragment Wa1 of the substrate W in the processing tank 15B, but may determine the presence or absence of any abnormality in the processing tank 15B.

As described above, the substrate processing apparatuses 100, 100A and the monitoring method have been described in detail, but the above description is an example in all aspects, and these are not limited thereto. Innumerable modifications not illustrated can be envisaged without departing from the scope of the present disclosure. The configurations described in the above embodiments and the modifications can appropriately be combined as long as they are not inconsistent with each other.

EXPLANATION OF REFERENCE SIGNS 10, 10B: chamber
100, 100A: substrate processing apparatus
20: substrate holder
20B: substrate holder (lifter)
26: chuck pin
30: nozzle (first nozzle)
60: nozzle (second nozzle)
68: nozzle (third nozzle)
41: guard (inner guard)
42: guard (middle guard)
43: guard (outer guard)
70, 70B: camera
71, 71B: illuminator
711, 711a to 711e: unit illuminator
73, 73B: polarizing filter
74, 74B: filter driver
9: controller
94: storage
S11: polarization adjustment step (step)
S12: imaging step (step)
S13: monitoring step (step)
W: substrate
The invention claimed is:
1. A substrate processing apparatus comprising:
a chamber;
a substrate holder that holds a substrate;
an illuminator that irradiates an imaging region including a monitoring target in said chamber with illumination light;

a polarizing filter that transmits light from said imaging region according to a polarization state of said light;
a filter driver that rotates said polarizing filter to a rotation position corresponding to said monitoring target to reduce unnecessary reflected light corresponding to said monitoring target using said polarizing filter;
a camera that captures an image of said imaging region through said polarizing filter to generate captured image data; and
a controller that controls said filter driver and monitors said monitoring target based on said captured image data generated by said camera,
wherein said illuminator includes a plurality of unit illuminators, and a unit illuminator that emits said illumination light among said plurality of unit illuminators is switched according to said monitoring target so as to enhance an effect of reducing said unnecessary reflected light by said polarizing filter.

2. The substrate processing apparatus according to claim 1, further comprising a storage that previously stores angle data indicating a rotation position of said polarizing filter corresponding to said monitoring target,
wherein said filter driver rotates said polarizing filter to said rotation position corresponding to said monitoring target based on said angle data.

3. A substrate processing apparatus according to claim 1 comprising:
a chamber;
a substrate holder that holds a substrate;
an illuminator that irradiates an imaging region including a monitoring target in said chamber with illumination light;
a polarizing filter that transmits light from said imaging region according to a polarization state of said light;
a filter driver that rotates said polarizing filter to a rotation position corresponding to said monitoring target to reduce unnecessary reflected light corresponding to said monitoring target using said polarizing filter;
a camera that captures an image of said imaging region through said polarizing filter to generate captured image data; and
a controller that controls said filter driver and monitors said monitoring target based on said captured image data generated by said camera, wherein said controller determines said rotation position of said polarizing filter based on a plurality of pieces of captured image data and said plurality of pieces of captured image data is generated by said camera capturing said image of said imaging region while said filter driver sequentially rotates said polarizing filter.

4. The substrate processing apparatus according to claim 3, wherein said controller determines said rotation position based on contrast of each of said plurality of pieces of captured image data or a number of contour lines in each of said plurality of pieces of captured image data.

5. The substrate processing apparatus according to claim 1, wherein
said filter driver rotates said polarizing filter to a first rotation position at which said unnecessary reflected light in a first determination region of said captured image data is reduced, said first determination region is used for monitoring a first monitoring target as said monitoring target,
said controller monitors said first monitoring target based on said first determination region of said captured image data generated when said polarizing filter is located at said first rotation position, said filter driver rotates said polarizing filter to a second rotation position at which said unnecessary reflected light in a second determination region of said captured image data is reduced, said second determination region is used for monitoring a second monitoring target as said monitoring target, and said controller monitors said second monitoring target based on said second determination region of said captured image data generated when said polarizing filter is located at said second rotation position.

6. The substrate processing apparatus according to claim 1, wherein said filter driver rotates said polarizing filter to a first rotation position at which said unnecessary reflected light from a first object is reduced when said first object exists in said imaging region, said controller monitors said monitoring target based on said captured image data generated when said polarizing filter is located at said first rotation position and said first object exists in said imaging region, said filter driver rotates said polarizing filter to a second rotation position at which said unnecessary reflected light from a second object is reduced when said second object exists in said imaging region, and said controller monitors said monitoring target based on said captured image data generated when said polarizing filter is located at said second rotation position and said second object exists in said imaging region.

7. The substrate processing apparatus according to claim 1, wherein said illuminator is provided vertically above said imaging region, and said camera is provided outside said illuminator with respect to said imaging region in planar view, and captures said image of said imaging region obliquely downward.

* * * * *